United States Patent
Chabries et al.

(10) Patent No.: US 6,885,752 B1
(45) Date of Patent: Apr. 26, 2005

(54) HEARING AID DEVICE INCORPORATING SIGNAL PROCESSING TECHNIQUES

(75) Inventors: Douglas Melvin Chabries, Orem, UT (US); Richard Wesley Christiansen, Highland, UT (US); Aaron Michael Hammond, Provo, UT (US); William Charles Borough, Fort Collins, CO (US)

(73) Assignee: Brigham Young University, Provo, UT (US)

( * ) Notice: Subject to any disclaimer, the term of this patent is extended or adjusted under 35 U.S.C. 154(b) by 0 days.

(21) Appl. No.: 09/444,972

(22) Filed: Nov. 22, 1999

Related U.S. Application Data

(63) Continuation-in-part of application No. 09/169,547, filed on Sep. 9, 1998, now abandoned, which is a continuation-in-part of application No. 08/697,412, filed on Aug. 22, 1996, now Pat. No. 6,072,885, which is a continuation-in-part of application No. 08/585,481, filed on Jan. 12, 1996, now Pat. No. 5,848,171, which is a continuation of application No. 08/272,927, filed on Jul. 8, 1994, now Pat. No. 5,500,902.

(51) Int. Cl.$^7$ .............................................. H04R 25/00
(52) U.S. Cl. ........................ 381/321; 381/312; 381/320; 381/106; 381/98; 455/232.1; 455/235.1; 455/306
(58) Field of Search ............................... 381/23.1, 106, 381/98, 99, 312, 320, 321, 107; 455/232.1, 234.1, 234.2, 235.1, 247.1, 251.1, 303, 306

(56) References Cited

U.S. PATENT DOCUMENTS

| | | | |
|---|---|---|---|
| 3,784,750 A | 1/1974 | Stearns et al. | 179/1 N |
| 3,920,931 A | 11/1975 | Yanick, Jr. | 179/107 |
| 3,927,279 A | 12/1975 | Nakamura et al. | 179/107 |

(Continued)

FOREIGN PATENT DOCUMENTS

| | | | |
|---|---|---|---|
| EP | 0 341 903 | 11/1989 | H04R/25/00 |
| EP | 0 714 067 | 6/1996 | G06F/13/38 |
| WO | WO 97/50186 | 12/1997 | |
| WO | 98/28943 | 7/1998 | H04R/25/00 |
| WO | WO 98/47227 | 10/1998 | |
| WO | 99/26453 | 5/1999 | H04R/25/00 |

OTHER PUBLICATIONS

Boll, S., "Suppression of Acoustic Noise in Speech Using Spectral Subtraction," Apr. 1979, IEEE Trans. on ASSP, vol. ASSP–27, pp. 113–120.

Brey, Robert H. et al., "Improvement in Speech Intelligibility in Noise Employing an Adaptive Filter with Normal and Hearing–Impaired Subjects," Journal of Rehabilitation Research and Development, vol. 24, No. 4, pp. 75–86.

(Continued)

*Primary Examiner*—Huyen Le
*Assistant Examiner*—Dionne Harvey
(74) *Attorney, Agent, or Firm*—Thelen Reid & Priest, LLP; David B. Ritchie

(57) ABSTRACT

A hearing compensation system for the hearing impaired comprises a plurality of bandpass filters having an input connected to an input transducer and each bandpass filter having an output connected to the input of one of a plurality of multiplicative AGC circuits whose outputs are summed together and connected to the input of an output transducer. The multiplicative AGC circuits attenuate acoustic signals having a constant background level without the loss of speech intelligibility. The identification of the background noise portion of the acoustic signal is made by the constancy of the envelope of the input signal in each of the several frequency bands. The background noise that will be suppressed includes multi-talker speech babble, fan noise, feedback whistle, florescent light hum, and white noise.

16 Claims, 16 Drawing Sheets

U.S. PATENT DOCUMENTS

| | | | |
|---|---|---|---|
| 3,989,904 A | 11/1976 | Rohrer et al. | 179/107 |
| 4,025,721 A | 5/1977 | Graupe et al. | 179/1 P |
| 4,052,571 A | 10/1977 | Gregory et al. | 179/107 R |
| 4,052,572 A | 10/1977 | Schafer | 179/107 R |
| 4,099,035 A | 7/1978 | Yanick | 179/107 |
| 4,118,604 A | 10/1978 | Yanick | 179/107 |
| 4,135,590 A | 1/1979 | Gaulder | 179/1 P |
| 4,185,168 A | 1/1980 | Graupe et al. | 179/1 P |
| 4,187,413 A | 2/1980 | Moser | 179/107 |
| 4,188,667 A | 2/1980 | Graupe et al. | 364/724 |
| 4,366,349 A | 12/1982 | Adelman | 179/107 |
| 4,396,806 A | 8/1983 | Anderson | 179/107 FD |
| 4,405,831 A | 9/1983 | Michelson | 179/1 P |
| 4,419,544 A | 12/1983 | Adelman | 179/107 |
| 4,425,481 A | 1/1984 | Mansgold et al. | 179/107 |
| 4,430,754 A | 2/1984 | Ishigaki | 455/72 |
| 4,471,171 A | 9/1984 | Köpke et al. | 179/107 R |
| 4,548,082 A | 10/1985 | Engebretson et al. | 73/585 |
| 4,589,133 A | 5/1986 | Swinbanks | |
| 4,589,137 A | 5/1986 | Miller | 381/94 |
| 4,602,337 A | 7/1986 | Cox | 364/480 |
| 4,628,529 A | 12/1986 | Borth et al. | 381/94 |
| 4,731,850 A | 3/1988 | Levitt et al. | 381/68.2 |
| 4,759,071 A | 7/1988 | Heide | 381/68.4 |
| 4,802,227 A | 1/1989 | Elko et al. | 381/92 |
| 4,852,177 A | 7/1989 | Ambrose | 381/154 |
| 4,882,762 A | 11/1989 | Waldhauer | 381/106 |
| 4,887,299 A | 12/1989 | Cummins et al. | 381/68.4 |
| 4,972,487 A | 11/1990 | Mangold et al. | 381/68 |
| 5,016,280 A | 5/1991 | Engebretson et al. | 381/68 |
| 5,027,410 A | 6/1991 | Williamson et al. | 381/68.4 |
| 5,029,217 A | 7/1991 | Chabries et al. | 381/68.2 |
| 5,083,312 A | 1/1992 | Newton et al. | 381/68.4 |
| 5,097,510 A | 3/1992 | Graupe | 381/47 |
| 5,259,033 A | 11/1993 | Goodings et al. | 381/68 |
| 5,278,912 A | 1/1994 | Waldhauer | 381/68.4 |
| 5,473,684 A | 12/1995 | Bartlett et al. | 379/387 |
| 5,500,902 A | 3/1996 | Stockham, Jr. et al. | 381/68.4 |
| 5,651,071 A | 7/1997 | Lindemann et al. | 381/68.2 |
| 5,687,242 A | 11/1997 | Iburg | 381/69.2 |
| 5,710,819 A | 1/1998 | T.o slashed.pholm et al. | 381/68.2 |
| 5,710,820 A | 1/1998 | Martin et al. | 381/68.4 |
| 5,721,783 A | 2/1998 | Anderson | 381/68.6 |
| 5,825,898 A | 10/1998 | Marash | 381/92 |
| 5,848,171 A * | 12/1998 | Stockham, Jr. et al. | |
| 5,867,581 A | 2/1999 | Obara | 381/312 |
| 6,023,517 A | 2/2000 | Ishige | 381/315 |
| 6,044,162 A | 3/2000 | Mead et al. | 381/312 |
| 6,072,885 A * | 6/2000 | Stockham, Jr. et al. | |
| 6,163,287 A | 12/2000 | Huang | 341/143 |

OTHER PUBLICATIONS

Chabries, Douglas M. et al., "Application of Adaptive Digital Signal Processing to Speech Enhancement for the Hearing Impaired", Journal of Rehabilitation Research and Development, vol. 24, No. 4, pp. 65–74.

Chabries, et al., "Noise Reduction by Amplitude Warping in the Spectral Domain in a Model–Based Algorithm", Jun. 11, 1997, Etymotic Update, No. 15.

Crozier, P. M., et al., "Speech Enhancement Employing Spectral Subtraction and Linear Predictive Analysis," 1993, Electronic Letters, 29(12): 1094–1095.

Killion, Mead, "The SIN Report: Circuits Haven't Solved The Hearing–in–Noise Problem," Oct. 1997, The hearing Journal, vol. 50, No. 20, pp. 28–34.

Sedra, A.S. et al., "Microelectronic Circuits", 1990, Holt Rinehart and Winston, pp. 60–65, 230–239, 900.

Sheikhzadeh, H. et al., "Comparative Performance of Spectral Subtraction and HMM–Based Speech Enhancement Strategies with Application to Hearing Aid Design," 1994, Proc. IEEE, ICASSP, pp. I–13 to I–17.

Yost, William A., "Fundamentals of Hearing, An Introduction," 1994, Academic Press, Third Edition, p. 307.

Sedra, A.S. et al., "Microelectronic Circuits", 1990, Holt Rinehart and Winston, pp. 60–65, 230–239, 900.

Sheikhzadeh, H. et al., "Comparative Performance of Spectral Subtraction and HMM–Based Speech Enhancement Strategies with Application to Hearing Aid Design," 1994, Proc. IEEE, ICASSP, pp. I–13 to I–17.

Siqueira et al., "Subband Adaptive Filtering Applied to Acoustic Feedback Reduction in Hearing Aids", 1997 IEEE, pp. 788–792.

Teder, Harry, "Hearing Instrument in Noise and the Syllable Speech–to–Noise Ratio," 1991, Hearing Instruments, vol. 42, No. 2.

Wyrsch et al., "Adaptive Feedback Cancelling in Subbands for Hearing Aids", 4 pages.

Yost, William A., "Fundamentals of Hearing, An Introduction," 1994, Academic Press, Third Edition, p. 307.

Best, Leland C., "Digital Suppression of Acoustic Feedback in Hearing Aids", May 1985, Thesis, University of Wyoming, Laramie, Wyoming.

Boll, S., "Suppression of Acoustic Noise in Speech Using Spectral Subtraction," Apr. 1979, IEEE Trans. on ASSP, vol. ASSP–27, pp. 113–120.

Brey, Robert H. et al., "Improvement in Speech Intelligibility in Noise Employing an Adaptive Filter with Normal and Hearing–Impaired Subjects," Journal of Rehabilitation Research and Development, vol. 24, No. 4, pp. 75–86.

Bustamante, et al., "Measurement and Adaptive Suppression of Acoustic Feedback in Hearing Aids", Nicolet Instruments, Madison, Wisconsin, pp. 2017–2020.

Chabries, Douglas M. et al., "Application of Adaptive Digital Signal Processing to Speech Enhancement for the Hearing Impaired", Journal of Rehabilitation Research and Development, vol. 24, No. 4, pp. 65–74.

Chabries, et al., "Application of a Human Auditory Model to Loudness Perception and Hearing Compensation", 1995, IEEE, pp. 3527–3530.

Crozier, P.M., et al., "Speech Enhancement Employing Spectral Subtraction and Linear Predictive Analysis," 1993, Electronic Letters, 29(12): 1094–1095.

"Delta–Sigma Overview", Fall 1996, ECE 627, 29 pages.

Estermann, Pius, "Feedback Cancellation in Hearing Aids: Results from Using Frequency–Domain Adaptive Filters", pp. 257–260.

Etter et al., "Noise Reduction by Noise–Adaptive Spectral Magnitude Expansion", May 1994, J. Audio Eng. Soc., vol. 42, No. 5, pp. 341–348.

Kaelin et al., "A digital frequency–domain implementation of a very high gain hearing aid with compensation for recruitment of loudness and acoustic echo cancellation", 1998, Signal Processing 64, pp. 71–85.

Karema, et al., "An Oversampled Sigma–Delta A/D Converter Circuit Using Two–Stage Fourth Order Modulator", 1990, IEEE, International Symposium on Circuits and Systems, vol. 4., pp. 3279–3282.

Kates, James M., "Feedback Cancellation in Hearing Aids: Results from a Computer Simulation", 1991, IEEE, Transactions on Signal Processing, vol. 39, No. 3, pp. 553–562.

Killion, Mead C., The K–Amp hearing Aid: An Attempt to Present High Fidelity for Persons with Impaired Hearing:, Jul. 1993, American Journal of Audiology, vol. 2, No. 2, pp. 52–74.

Killion, Mead, "The SIN Report: Circuits Haven't Solved the Hearing–in–Noise Problem," Oct. 1997, The Hearing Journal, vol. 50, No. 20, pp. 28–34.

Kuo, et al., "Integrated Frequency–Domain Digital Hearing Aid with the Lapped Transform", Sep. 10, 1992, Northern Illinois University, Department of Electrical Engineering, 2 pages.

Maxwell, et al., "Reducing Acoustic Feedback in Hearing Aids", 1995, IEEE, Transactions on Speech and Audio Processing, vol. 3, No. 4, pp. 304–313.

Norsworthy, Steven R., "Delta–Sigma Data Converters", IEEE Circuits & Systems Society, pp. 321–324.

Plomp, R., "The Negative Effect of Amplitude Compression in Hearing Aids in the Light of the Modulation–Transfer Function," Jun. 1983, Journal of the Acoustical Society of America, vol. 83, No. 6, pp. 2322–2327.

Quatieri, et al., "Noise Reduction Based on Spectral Change", MIT Lincoln Laboratory, Lexington, MA, 4 pages.

Riley, et al., "High–Decimation Digital Filters", 1991, IEEE, pp. 1613–1615.

Chabries, et al., "Application of a Human Auditory model to Loudness Perception and Hearing Compensation", 1995, IEEE, pp. 3527–3530.

Stockham, Thomas G., Jr., "The Application of Generalized Linearity to Automatic Gain Control", Jun. 1968, IEEE, Transactions on Audio and Electroacoustics, vol. AU–16, No. 2, pp. 267–270.

* cited by examiner

HEARING AID DEVICE INCORPORATING SIGNAL PROCESSING TECHNIQUES

RELATED APPLICATIONS

This application is a continuation-in-part of U.S. patent application, Ser. No. 09/169,547, filed Sep. 9, 1998, now abandoned, which is a continuation-in-part of U.S. patent application, Ser. No. 08/697,412, filed Aug. 22, 1996, now U.S. Pat. No. 6,072,885, which is a continuation-in-part of U.S. patent application, Ser. No. 08/585,481, filed Jan. 12, 1996, now U.S. Pat. No. 5,848,171, which is a continuation of U.S. patent application, Ser. No. 08/272,927, filed Jul. 8, 1994, now U.S. Pat. No. 5,500,902.

BACKGROUND OF THE INVENTION

1. Field of the Invention

The present invention relates to electronic hearing devices and electronic systems for sound reproduction. More particularly, the present invention relates to noise suppression to preserve the fidelity of signals in electronic hearing aid devices and electronic sound systems. According to the present invention, the noise suppression devices and methods utilize both analog and digital signal processing techniques.

2. The Prior Art

One of the most common complaints made by hearing aid users is the inability to hear in the presence of noise. Accordingly, the suppression of noise has long been the focus of researchers, and many approaches to solving the noise suppression problem have been proposed. In one approach, an independent measure of the noise is made and then subtracted from the signal being processed. This technique is typically applied to signals that are expressed as follows:

$$s(t)=d(t)+n(t)$$

Wherein s(t) is the signal being processed, d(t) is the desired portion of the signal s(t), and n(t) the noise in the signal s(t).

For example, one or more sensors may be employed along with adaptive techniques to form an independent measure of the estimate of the noise, $n_e(t)$ from interference. By subtracting the noise estimate, $n_e(t)$, from the signal, s(t), an improved version of the desired signal, d(t), is obtained. To emphasize the subtraction of the noise estimate, $n_e(t)$, this technique is commonly referred to as "noise canceling." This noise canceling technique has been applied to both sonar systems and medical fetal electrocardiograms, and has further been found to be effective to process acoustic signals containing both speech and interference. See for example, Douglas M. Chabries, et al., "Application of Adaptive Digital Signal Processing to Speech Enhancement for the Hearing Impaired," Journal of Rehabilitation Research and Development, Vol. 24, No. 4, pp. 65–74, and Robert H. Brey, et al., "Improvement in Speech Intelligibility in Noise Employing an Adaptive Filter with Normal and Hearing-Impaired Subjects," Journal of Rehabilitation Research and Development, Vol., 24, No. 4, pp. 75–86.

When no independent sample or estimate of the noise is available, other techniques to provide noise suppression have been employed. In several instances, researchers have exploited the differences in the temporal properties of speech and noise to enhance the intelligibility of sound. These techniques are typically referred to as noise suppression or speech enhancement. See for example, U.S. Pat. No. 4,025,721 to Graupe, U.S. Pat. No. 4,185,168 to Graupe, and S. Boll, "Suppression of Acoustic Noise in Speech Using Spectral Subtraction," IEEE Trans. on ASSP, Vol. ASSP-27, pp. 113–120, April 1979, H. Sheikhzadeh, et al., "Comparative Performance of Spectral Subtraction and HMM-Based Speech Enhancement Strategies with Application to Hearing Aid Design," Proc. IEEE ICASSP, pp. I-13 to I-17, 1994, and P. M Crozier, B M G Cheethan, C. Holt, and E. Munday, "Speech enhancement employing spectral subtraction and linear predictive analysis," Electronic Letters, 29(12) :1094–1095, 1993.

These approaches have been shown to enhance particular signals in comparison to other signals that have been defined as noise. One researcher, Mead Killion, has noted that none of these approaches has enhanced speech intelligibility. See Mead Killion, Etymotic Update, Number 15, Spring 1997. However, in low noise environments, compression techniques have been shown to relieve hearing deficits. See Mead Killion, "The SIN report: Circuits haven't solved the hearing-in-noise problem," The Hearing Journal, Vol. 50, No. 20, October 1997, pp. 28–34.

With these techniques, researchers have generally noted a decrease in speech intelligibility testing when noise contaminated speech is processed, despite the fact that measures of quality or preference increase. Typically, the specification of the noise characteristics or the definition of the speech parameters distinguishes the various techniques in the second category of noise suppression from one another. It has been demonstrated that acoustic signals can be successfully processed according to these techniques to enhance voiced or vowel sounds in the presence of white or impulsive noise, however, these techniques are less successful in preserving unvoiced sounds such as fricatives or plosives.

Other noise suppression techniques have been developed wherein speech is detected and various proposed methods are employed to either turn off the amplifier in a hearing aid when speech is not present or to clip speech and then turn off the output amplifier in the absence of detectable speech. See for example, Harry Teder, "Hearing Instruments in Noise and the Syllabic Speech-to-Noise Ratio," Hearing Instruments, Vol. 42, No. 2, 1991. Further examples of the approach to noise suppression by suppressing noise to enhance the intelligibility of sound are found in U.S. Pat. No. 4,025,721 to Graupe, U.S. Pat. No. 4,405,831 to Michaelson, U.S. Pat. No. 4,185,168 to Graupe et al., U.S. Pat. No. 4,188,667 to Graupe et al., U.S. Pat. No. 4,025,721 to Graupe et al., U.S. Pat. No. 4,135,590 to Gaulder, and U.S. Pat. No. 4,759,071 to Heide et al.

Other approaches have focussed upon feedback suppression and equalization (U.S. Pat. No. 4,602,337 to Cox, and U.S. Pat. No. 5,016,280 to Engebretson, and see also Leland C. Best, "Digital Suppression of Acoustic Feedback in Hearing Aids," Thesis, University of Wyoming, May 1995 and Rupert L. Goodings, Gideon A. Senensieb, Phillip H. Wilson, Roy S. Hansen, "Hearing Aid Having Compensation for Acoustic Feedback," U.S. Pat. No. 5,259,033 issued Nov. 2, 1993.), dual microphone configurations (U.S. Pat. No. 4,622,440 to Slavin and U.S. Pat. No. 3,927,279 to Nakamura et al.), or upon coupling to the ear in unusual ways (e.g., RF links, electrical stimulation, etc.) to improve intelligibility. Examples of these approaches are found in U.S. Pat. No. 4,545,082 to Engebretson, U.S. Pat. No. 4,052,572 to Shafer, U.S. Pat. No. 4,852,177 to Ambrose, and U.S. Pat. No. 4,731,850 to Levitt.

Still other approaches have opted for digital programming control implementations which will accommodate a multitude of compression and filtering schemes. Examples of such approaches are found in U.S. Pat. No. 4,471,171 to Kopke et al. and U.S. Pat. No. 5,027,410 to Williamson. Some approaches, such as that disclosed in U.S. Pat. No. 5,083,312 to Newton, utilize hearing aid structures which allow flexibility by accepting control signals received remotely by the aid.

U.S. Pat. No. 4,187,413 to Moser discloses an approach for a digital hearing aid which uses an analog-to-digital converter and a digital-to-analog converter, and implements a fixed transfer function H(z). However, a review of neuropsychological models in the literature and numerous measurements resulting in Steven's and Fechner's laws (see S. S. Stevens, *Psychophysics*, Wiley 1975; G. T. Fechner, *Elemente der Psychophysik*, Breitkopf u. Härtel, Leipzig, 1960) conclusively reveals that the response of the ear to input sound is nonlinear. Hence, no fixed linear transfer function H(z) exists which will fully compensate for hearing.

U.S. Pat. No. 4,425,481 to Mansgold, et. al. discloses a programmable digital signal processing (DSP) device with features similar or identical to those commercially available, but with added digital control in the implementation of a three-band (lowpass, bandpass, and highpass) hearing aid. The outputs of the three frequency bands are each subjected to a digitally controlled variable attenuator, a limiter, and a final stage of digitally controlled attenuation before being summed to provide an output. Control of attenuation is apparently accomplished by switching in response to different acoustic environments.

U.S. Pat. Nos. 4,366,349 and 4,419,544 to Adelman describe and trace the processing of the human auditory system, but do not reflect an understanding of the role of the outer hair cells within the ear as a muscle to amplify the incoming sound and provide increased basilar membrane displacement. These references assume that hearing deterioration makes it desirable to shift the frequencies and amplitude of the input stimulus, thereby transferring the location of the auditory response from a degraded portion of the ear to another area within the ear (on the basilar membrane) which has adequate response.

Mead C. Killion, *The k-amp hearing aid: an attempt to present high fidelity for persons with impaired hearing*, American Journal of Audiology, 2(2): pp. 52–74, July 1993, states that based upon the results of subjective listening tests for acoustic data processed with both linear gain and compression, either approach performs equally well. It is argued that the important factor in restoring hearing for individuals with hearing losses is to provide the appropriate gain. In the absence of a mathematically modeled analysis of that gain, several compression techniques have been proposed, e.g., U.S. Pat. No. 4,887,299 to Cummins; U.S. Pat. No. 3,920,931 to Yanick, Jr.; U.S. Pat. No. 4,118,604 to Yanick, Jr.; U.S. Pat. No. 4,052,571 to Gregory; U.S. Pat. No. 4,099,035 to Yanick, Jr. and U.S. Pat. No. 5,278,912 to Waldhauer. Some involve a linear fixed high gain at soft input sound levels and switch to a lower gain at moderate or loud sound levels. Others propose a linear gain at soft sound intensities, a changing gain or compression at moderate intensities and a reduced, fixed linear gain at high or loud intensities. Still others propose table look-up systems with no details specified concerning formation of look-up tables, and others allow programmable gain without specification as to the operating parameters.

Switching between the gain mechanisms in each of these sound intensity regions has introduced significant distracting artifacts and distortion in the sound. Further, these gain-switched schemes have been applied typically in hearing aids to sound that is processed in two or three frequency bands, or in a single frequency band with pre-emphasis filtering.

Insight into the difficulty with prior art gain-switched schemes may be obtained by examining the human auditory system. For each frequency band where hearing has deviated from the normal threshold, a different sound compression is required to provide normal hearing sensation. Therefore, the application of gain schemes which attempt to use a frequency band wider than a single critical band (i.e., critical band as defined in "Fundamentals of Hearing, An Introduction," Third Edition by William A. Yost, Academic Press, 1994, page 307) cannot produce the optimum hearing sensation in the listener. If, for example, it is desired to use a frequency bandwidth which is wider than the bandwidth of the corresponding critical bandwidth, then some conditions must be met in order for the wider bandwidth to optimally compensate for the hearing loss. These conditions are that the wider bandwidth must exhibit the same normal hearing threshold and dynamic range and require the same corrective hearing gain as the critical bands contained within the wider bandwidth. In general, this does not occur even if a hearing loss is constant in amplitude across several critical bands of hearing. Failure to properly account for the adaptive full-range compression will result in degraded hearing or equivalently, loss of fidelity and intelligibility perceived by the hearing impaired listener. Therefore, mechanisms as disclosed, which do not provide a sufficient number of frequency bands to compensate for hearing losses, will produce sound which is of less benefit to the listener in terms of the quality (user preference) and intelligibility.

Several schemes have been proposed which use multiple bandpass filters followed by compression devices (see U.S. Pat. No. 4,396,806 to Anderson, U.S. Pat. No. 3,784,750 to Stearns et al., and U.S. Pat. No. 3,989,904 to Rohrer).

One example of prior art in U.S. Pat. No. 5,029,217to Chabries focused on a Fast Fourier Transform (FFT) frequency domain version of a human auditory model. As known to those skilled in the art, the FFT can be used to implement an efficiently-calculated frequency domain filter bank which provides fixed filter bands. As described herein, it is preferred to use bands that approximate the critical band equivalents which naturally occur in the ear due to its unique geometry and makeup. The use of critical bands for the filter bank design allows the construction of a hearing aid which employs wider bandwidths at higher frequencies while still providing the full hearing benefit. Because the resolution of the FFT filter bank must be set to the value of the smallest bandwidth from among the critical bands to be compensated, the efficiency of the FFT is in large part diminished by the fact that many additional filter bands are required in the FFT approach to cover the same frequency spectrum. This FFT implementation is complex and likely not suitable for low-power battery applications.

As known to those skilled in the art, prior-art FFT implementations introduce a block delay by gathering and grouping blocks of samples for insertion into the FFT algorithm. This block delay introduces a time delay into the sound stream which may be long enough to be annoying and to induce stuttering when one tries to speak. An even longer delay could occur which sounds like an echo when low levels of compensation are required for the hearing impaired individual.

For acoustic input levels below hearing threshold (i.e. soft background sounds which are ever present), the FFT implementation described above provides excessive gain. This results in artifacts which add noise to the output signal. At hearing compensation levels greater than 60 dB, the processed background noise level can become comparable to the desired signal level in intensity, thereby introducing distortion and reducing sound intelligibility.

As noted above, the hearing aid literature has proposed numerous solutions to the problem of hearing compensation for the hearing impaired. While the component parts that are required to assemble a high fidelity, full-range, adaptive compression system have been known since 1968, no one has to date proposed the application of the multiplicative AGC to the several bands of hearing to compensate for hearing losses.

As will be appreciated by those of ordinary skill in the art, there are three aspects to the realization of a high effectiveness aid for the hearing impaired. The first is the conversion of sound energy into electrical signals. The second is the processing of the electrical signals so as to compensate for the impairment of the particular individual which includes the suppression of noise from the acoustic signal being input to a hearing aid user while preserving the intelligibility of the acoustic signal. Finally, the processed electrical signals must be converted into sound energy in the ear canal.

Modern electret technology has allowed the construction of extremely small microphones with extremely high fidelity, thus providing a ready solution to the first aspect of the problem. The conversion of sound energy into electrical signals can be implemented with commercially available products. A unique solution to the problem of processing of the electrical signals to compensate for the impairment of the particular individual is set forth herein and in parent application Ser. No. 08/272,927 filed Jul. 8, 1994, now U.S. Pat. No. 5,500,902. The third aspect has, however, proved to be problematic, and is addressed by the present invention.

An in-the-ear hearing aid must operate on very low power and occupy only the pace available in the ear canal. Since the hearing-impaired individual has lower sensitivity to sound energy than a normal individual, the hearing aid must deliver sound energy to the ear canal having an amplitude large enough to be heard and understood. The combination of these requirements dictates that the output transducer of the hearing aid must have high efficiency.

To meet this requirement transducer manufacturers such as Knowles have designed special iron-armature transducers that convert electrical energy into sound energy with high efficiency. To date, this high efficiency has been achieved at the expense of extremely poor frequency response.

The frequency response of prior art transducers not only falls off well before the upper frequency limit of hearing, but also shows resonances starting at about 1 to 2 kHz, in a frequency range where they confound the information most useful in understanding human speech. These resonances significantly contribute to the feedback oscillation so commonly associated with hearing aids, and subject signals in the vicinity of the resonant frequencies to severe intermodulation distortion by mixing them with lower frequency signals. These resonances are a direct result of the mass of the iron armature, which is required to achieve good efficiency at low frequencies. In fact it is well known to those of ordinary skill in the art of transducer design that any transducer that is highly efficient at low frequencies will exhibit resonances in the mid-frequency range.

A counterpart to this problem occurs in high-fidelity loudspeaker design, and is solved in a universal manner by introducing two transducers, one that provides high efficiency transduction at low frequencies (a woofer), and one that provides high-quality transduction of the high frequencies (a tweeter). The audio signal is fed into a crossover network which directs the high frequency energy to the tweeter and the low frequency energy to the woofer. As will be appreciated by those of ordinary skill in the art, such a crossover network can be inserted either before or after power amplification.

From the above recitation, it should be appreciated that many approaches have been taken in the hearing compensation art to improve the intelligibility of the acoustic signal being input to the user of a hearing compensation device. These techniques include both compensating for the hearing deficits of the hearing impaired individual by various methods, and also for removing or suppressing those aspects of the acoustic signal, such as noise, that produce an undesirable effect on the intelligibility of the acoustic signal. Despite the multitude of approaches, as set forth above, that have been adopted to provide improved hearing compensation for hearing impaired individuals, there remains ample room for improvement.

BRIEF DESCRIPTION OF THE INVENTION

According to the present invention, a hearing compensation system for the hearing impaired comprises a plurality of bandpass filters having an input connected to an input transducer and each bandpass filter having an output connected to the input of one of a plurality of multiplicative AGC circuits whose outputs are summed together and connected to the input of an output transducer.

The multiplicative AGC circuits attenuate acoustic signals having a constant background level without removing the portions of the speech signal which contribute to intelligibility. The identification of the background noise portion of the acoustic signal is made by the constancy of the envelope of the input signal in each of the several frequency bands. It is presently contemplated that examples of background noise that will be suppressed according to the present invention include multi-talker speech babble, fan noise, feedback whistle, florescent light hum, and white noise.

BRIEF DESCRIPTION OF THE DRAWING FIGURES

DETAILED DESCRIPTION OF A PREFERRED EMBODIMENT

Figure 1:
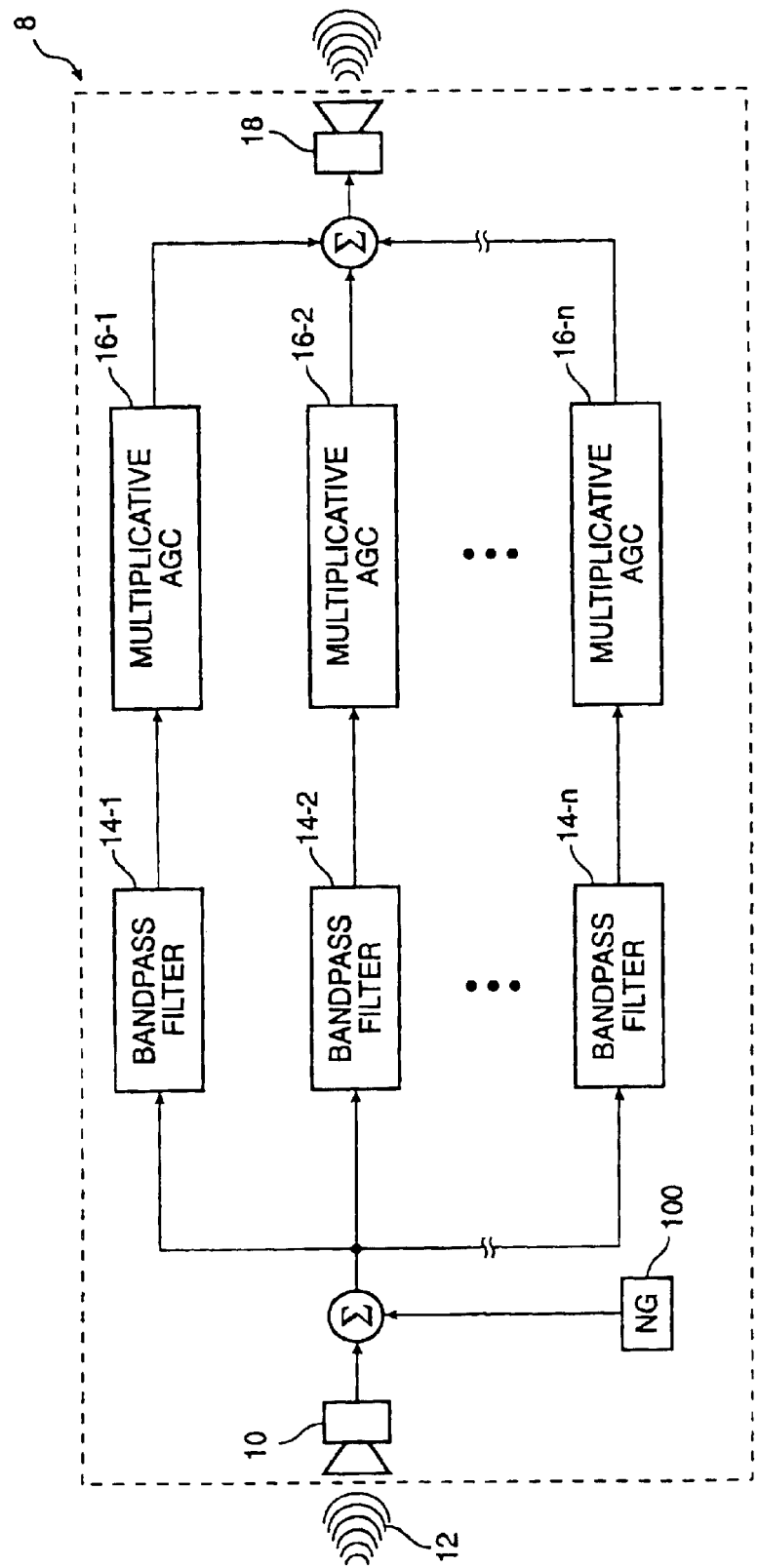
FIG. 1 illustrates a block diagram of a hearing compensation system according to the present invention.

Those of ordinary skill in the art will realize that the following description of the present invention is illustrative only and not in any way limiting. Other embodiments of the invention will readily suggest themselves to such skilled persons.

It has been discovered that the appropriate approach to high fidelity hearing compensation is to separate the input acoustic stimulus into frequency bands with a resolution at least equal to the critical bandwidth, which for a large range of the sound frequency spectrum is less than ⅓ octave, and apply a multiplicative AGC with either a fixed or variable exponential gain coefficient for each band.

According to the present invention, the multiplicative AGC circuits attenuate acoustic signals having a constant background level without removing the portions of the speech signal which contribute to intelligibility. The portion of the input signal which comprises the background noise portion of the acoustic signal is attenuated in amplitude without distortion to preserve the intelligibility of the acoustic input signal. The identification of the background noise portion of the acoustic signal is made by the constancy of the envelope of the input signal in each of the several frequency bands, as will be described below.

During highly dynamic variations in sound level, the output signal of the hearing compensation circuit due to its noise suppression feature will be nearly the same as the output of the hearing compensation system without such noise suppression features, and that during the quiescent periods between words that the output signal will have a significantly quieter background level due to the noise suppression of the present invention. It is presently contemplated that examples of background noise that will be suppressed according to the present invention include multi-talker speech babble, fan noise, feedback whistle, florescent light hum, other colored noise and white noise.

Those of ordinary skill in the art will recognize that the principles of the present invention may be applied to audio applications other than just hearing compensation for the hearing impaired. Non-exhaustive examples of other applications of the present invention include music playback for environments with high noise levels, such as automotive environments, voice systems in factory environments, and graphic sound equalizers such as those used in stereophonic sound systems.

As will be appreciated by persons of ordinary skill in the art, the circuit elements of the hearing compensation apparatus of the present invention may be implemented as either an analog circuit or as a digital circuit, preferably a microprocessor or other computing engine performing digital signal processing (DSP) functions to emulate the analog circuit functions of the various components such as filters, amplifiers, etc. It is presently contemplated that the DSP version of the circuit is the preferred embodiment of the invention, but persons of ordinary skill in the art will recognize that an analog implementation, such as might be integrated on a single semiconductor substrate, will also fall within the scope of the invention. Such skilled persons will also realize that in a DSP implementation, the incoming audio signal will have to be time sampled and digitized using conventional analog to digital conversion techniques.

Referring first to FIG. 1, a block diagram of a presently preferred hearing compensation system 8 according to the present invention is presented. The hearing compensation system 8 according to a presently preferred embodiment of the invention includes an input transducer 10 for converting acoustical energy (shown schematically at reference numeral 12) into an electrical signal corresponding to that acoustical energy. Various known hearing-aid microphone transducers, such as a model EK 3024, available from Knowles Electronics of Ithaca, Ill., are available for use as input transducer 10, or other microphone devices may be employed.

In FIG. 1, three audio bandpass filters are shown at reference numerals 14-1, 14-2 . . . 14-n to avoid over complicating the drawing. According to a presently preferred embodiment of the invention, n will be an integer from 9 to 15, although persons of ordinary skill in the art will understand that the present invention will function even if n is a different integer.

There are preferably nine audio bandpass filters 14-1 to 14-n having a bandpass resolution of approximately ½ octave. The bandpass filters 14-1 through 14-n are preferably realized as fifth-order Chebychev band-split filters which provide smooth frequency response in the passband and about 65 dB attenuation in the stopband. The design of ½ octave bandpass filters is well within the level of skill of the ordinary worker in the art. Therefore the details of the circuit design of any particular bandpass filter, whether implemented as an analog filter or as a DSP representation of an analog filter, will be simply a matter of design choice for such skilled persons.

In an alternative embodiment, audio bandpass filters 14-1 to 14-n preferably have a bandpass resolution of ⅓ octave or less, but in no case less than about 125 Hz, and have their center frequencies logarithmically spaced over a total audio spectrum of from about 200 Hz to about 10,000 Hz. The audio bandpass filters may have bandwidths broader than ⅓ octave, i.e., up to an octave or so, but with degrading performance. In this alternative embodiment, the bandpass filters 14-1 through 14-n are realized as eighth-order Elliptic filters with about 0.5 dB ripple in the passband and about 70 dB rejection in the stopband.

Those of ordinary skill in the art will recognize that several bandpass filter designs including, but not limited to, other Elliptic, Butterworth, Chebyshev, or Bessel filters, may be employed. Further, filter banks designed using wavelets, as disclosed, for example, in R. A. Gopinath, "Wavelets and Filter Banks—New Results and Applications," Ph.D Dissertation, Rice University, Houston, Tex., May 1993, may offer some advantage. Any of these bandpass filter designs may be employed without deviating from the concepts of the invention disclosed herein.

Each individual bandpass filter 14-1 to 14-n is cascaded with a corresponding multiplicative automatic gain control (AGC) circuit. Three such devices 16-1, 16-2, and 16-n are shown in FIG. 1. Multiplicative AGC circuits are known in the art and an exemplary configuration will be disclosed further herein.

The outputs of the multiplicative AGC circuits are summed together and are fed to an output transducer 18, which converts the electrical signals into acoustical energy. As will be appreciated by those of ordinary skill in the art, output transducer 18 may be one of a variety of known available hearing-aid earphone transducers, such as a model ED 1932, available from Knowles Electronics of Ithaca, Ill., in conjunction with a calibrating amplifier to ensure the transduction of a specified electrical signal level into the correspondingly specified acoustical signal level. Alternately, output transducer 18 may be another earphone-like device or an audio power amplifier and speaker system.

Figure 2A:
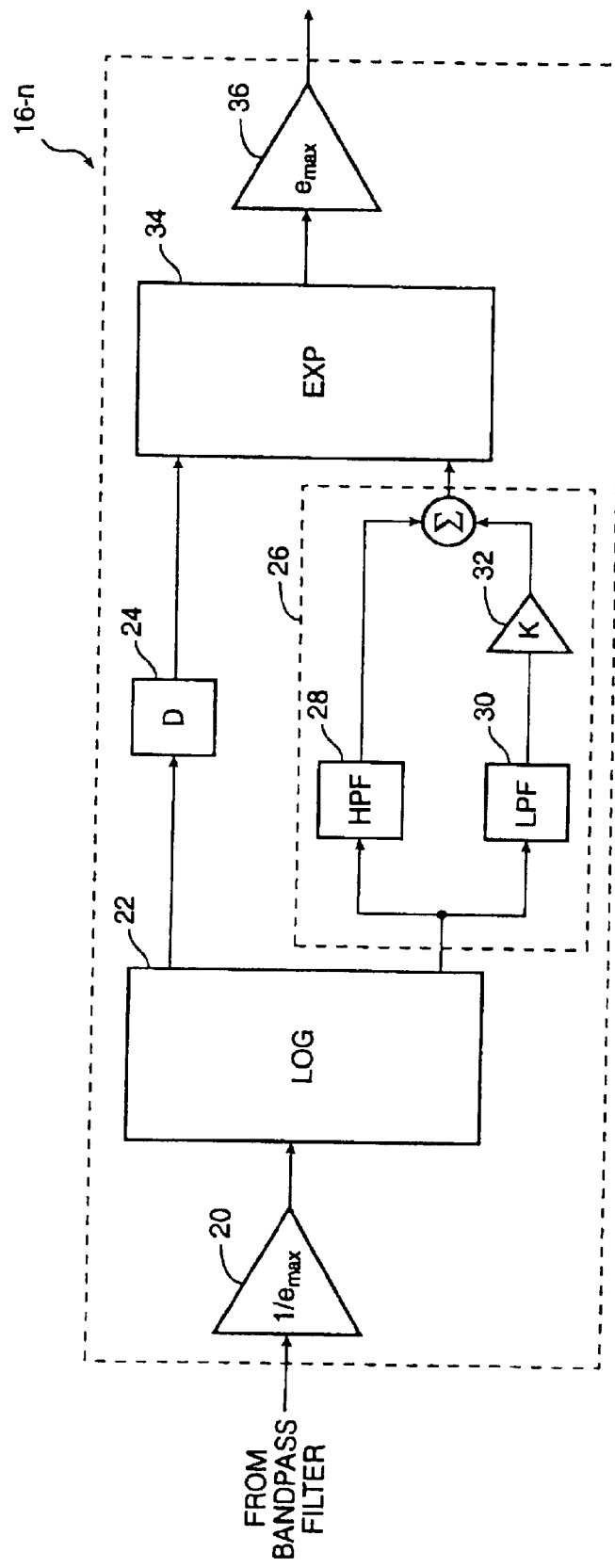
FIG. 2A illustrates a block diagram of a first embodiment of a multiplicative AGC circuit suitable for use according to the present invention.

Referring now to FIG. 2A, a more detailed conceptual block diagram of a typical multiplicative AGC circuit 16-n suitable for use according to the present invention is shown. As previously noted, multiplicative AGC circuits are known in the art. An illustrative multiplicative AGC circuit which will function in the present invention is disclosed in the article T. Stockham, Jr., *The Application of Generalized Linearity to Automatic Gain Control*, IEEE Transactions on Audio and Electroacoustics, AU-16(2): pp. 267–270, June 1968. A similar example of such a multiplicative AGC circuit may be found in U.S. Pat. No. 3,518,578 to Oppenheim et al.

Conceptually, the multiplicative AGC circuit 16-n which may be used in the present invention accepts an input signal at amplifier 20 from the output of one of the audio bandpass filters 14-n. Amplifier 20 is set to have a gain of $1/e_{max}$, where $e_{max}$ is the maximum allowable value of the audio envelope for which AGC gain is applied (i.e., for input levels above $e_{max}$, AGC attenuation results). Within each band segment in the apparatus of the present invention, the quantity $e_{max}$ is the maximum acoustic intensity for which gain is to be applied. This gain level for $e_{max}$ (determined by audiological examination of a patient) often corresponds to the upper comfort level of sound. In an analog implementation of the present invention, amplifier 20 may be a known operational amplifier circuit, and in a DSP implementation, amplifier 20 may be a multiplier function having the input signal as one input term and the constant $1/e_{max}$ as the other input term.

The output of amplifier 20 is processed in the "LOG" block 22 to derive the logarithm of the signal. The LOG block 22 derives a complex logarithm of the input signal, with one output representing the sign of the input signal and the other output representing the logarithm of the absolute value of the input. Those of ordinary skill in the art will recognize that by setting the gain of the amplifier 20 to $1/e_{max}$, the output of amplifier 20 (when the input is less than $e_{max}$) will never be greater than one and the logarithm term out of LOG block 22 will always be 0 or less.

In a DSP implementation, LOG block 22 is realized preferably by employing a circuit that converts binary numbers to a floating point format in a manner consistent with the method described in "ADSP-2100 Family Applications Handbook," Volume 1, published by Analog Devices, pp. 46–48. In this implementation, several different bases for the logarithm may be employed. The LOG block 22 may be alternatively implemented as a software subroutine running on a microprocessor or similar computing engine as is well known in the art, or from other equivalent means such as a look-up table. Examples of such implementations are found in Knuth, Donald E., The Art of Computer Programming, Vol. 1, Fundamental Algorithms, Addison-Wesley Publishing 1968, pp. 21–26 and Abramowitz, M. and Stegun, I. A., Handbook of Mathematical Functions, US Department of Commerce, National Bureau of Standards, Appl. Math Series 55, 1968.

Figure 8:
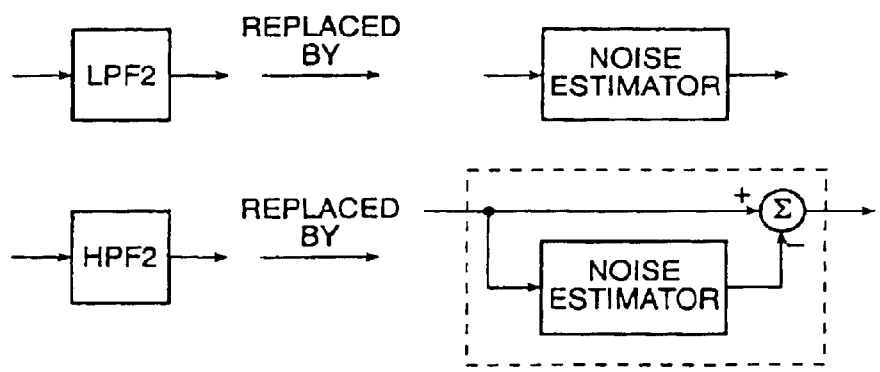
FIG. 8 illustrates a noise estimator suitable for replacing the filters depicted in FIGS. 5C and 5D according to the present invention.

In an analog implementation of the present invention, LOG block 22 may be, for example, an amplifier having a logarithmic transfer curve, or a circuit such as the one shown in FIGS. 8 and 9 of U.S. Pat. No. 3,518,578.

Figure 3:
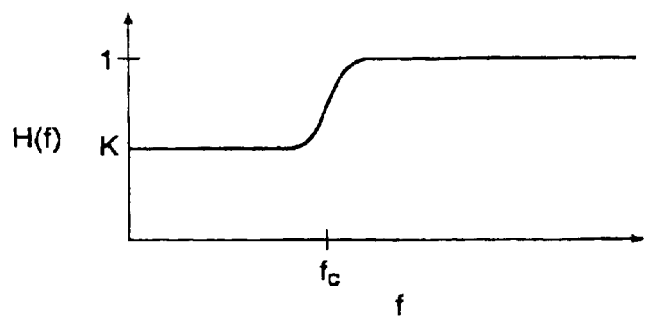
FIG. 3 is a plot of the response characteristics of the filter employed in the multiplicative AGC circuit of FIG. 2A.

The first output of LOG block 22 containing the sign information of its input signal is presented to a Delay block 24, and a second output of LOG block 22 representing the logarithm of the absolute value of the input signal is presented to a filter 26 having a characteristic preferably like that shown in FIG. 3. Conceptually, filter 26 may comprise both high-pass filter 28 and low-pass filter 30 followed by amplifier 32 having a gain equal to K, where, as shown in FIG. 3, gain factor K has a value less than 1 at frequency below fc. It should be noted that the gain factor K shown in FIG. 3 may be chosen to be a different value for each of the multiplicative AGC circuits 16-1 through 16-n, but once chosen for that channel the value of K will remain constant. As will be appreciated by those of ordinary skill in the art, high-pass filter 28 may be synthesized by subtracting the output of the low-pass filter 30 from its input.

Both high-pass filter 28 and low-pass filter 30 have a cutoff frequency that is determined by the specific application. In a hearing compensation system application according to the embodiments depicted in FIGS. 2A-2C, where the LOG operation is performed prior to the low-pass operation, it is preferred that a nominal cutoff frequency of about 16 Hz be employed. However, it should be appreciated that other cutoff frequencies may be chosen for low-pass filter 30 up to about ⅛ of the critical bandwidth associated with the frequency band being processed without deviating from the concepts of this invention. Those of ordinary skill in the art will recognize that filters having response curves other than that shown in FIG. 3 may be used in the present invention. For example, other non-voice applications of the present invention may require a cutoff frequency higher or lower than fc=16 Hz in FIG. 3.

The sign output of the LOG block 22 which feeds delay 24 has a value of either 1 or 0 and is used to keep track of the sign of the input signal to LOG block 22. The delay 24 is such that the sign of the input signal is fed to the EXP block 34 at the same time as the data representing the absolute value of the magnitude of the input signal, resulting in the proper sign at the output. In the present invention, the delay is made equal to the delay of the high-pass filter 28.

Those of ordinary skill in the art will recognize that many designs exist for amplifiers and for both passive and active analog filters as well as for DSP filter implementations, and that the design for the filters described herein may be elected from among these available designs. For example, in an analog implementation of the present invention, high-pass filter 28 and low-pass filter 30 may be conventional high-pass and low-pass filters of known designs, such as examples found in Van Valkenburg, M. E., Analog Filter Design, Holt, Rinehart and Winston, 1982, pp. 58–59. Amplifier 32 may be a conventional operational amplifier. In a digital implementation of the present invention, amplifier 32 may be a multiplier function having the input signal as one input term and a constant K as the other input term. DSP filter techniques are well understood by those of ordinary skill in the art.

The outputs of high-pass filter 28 and amplifier 32 are combined (i.e. added together) and presented to the input of EXP block 34 along with the unmodified but delayed output of LOG block 22. EXP block 34 processes the signal to provide an exponential function. The sign of the output from EXP block 34 is determined by the output from the delay D block 24. In a DSP implementation, EXP block 34 is preferably realized as described in "ADSP-2100 Family Applications Handbook," Volume 1, 1995, published by Analog Devices, pp. 52–67. EXP block 34 preferably has a base that corresponds to the base employed by LOG block 22. The EXP block 34 may alternatively be implemented as a software subroutine as is well known in the art, or from other equivalent means such as a look-up table. Examples of known implementations of this function are found in the Knuth and Abramowitz et al. references, and in U.S. Pat. No. 3,518,578, previously cited.

In an analog implementation of the present invention, EXP block 34 may be an amplifier with an exponential transfer curve. Examples of such circuits are found in FIGS. 8 and 9 of U.S. Pat. No. 3,518,578.

Sound may be conceptualized as the product of two components. The first is the always positive slowly varying envelope which may be written as e(t), and the second is the rapidly varying carrier which may be written as v(t). The total sound may be expressed as:

$$s(t)=e(t) \cdot v(t)$$

which is the input to block 20 of FIG. 2A.

Since an audio waveform is not always positive (i.e., v(t) is negative about half of the time), its logarithm at the output of LOG block 22 will have a real part and an imaginary part. If LOG block 22 is configured to process the absolute value of s(t) scaled by $e_{max}$, its output will be the sum of log[e(t)/$e_{max}$] and log |v(t)|. Since log |v(t)| contains high frequencies, it will pass through high-pass filter 28 essentially unaffected. The component log[e(t)/$e_{max}$] contains low frequency components and will be passed by low-pass filter 30 and emerges from amplifier 32 as K log[e(t)/$e_{max}$]. The output of EXP block 34 will therefore be:

$$(e(t)/e_{max})^K \cdot v(t)$$

The output of EXP block 34 is fed into amplifier 36 with a gain of $e_{max}$ in order to rescale the signal to properly correspond to the input levels which were previously scaled by 1/$e_{max}$ in amplifier 20. Amplifiers 20 and 36 are similarly configured except that their gains differ as just explained.

When K<1, it may be seen that the processing in the multiplicative AGC circuit 16-n of FIG. 2A performs a compression function. Persons of ordinary skill in the art will recognize that embodiments of the present invention using these values of K are also useful for applications other than hearing compensation.

According to such embodiments of the invention employed as a hearing compensation system, K may be a variable with a value between zero and 1. The value of K will be different for each frequency band for each hearing impaired person, and may be defined as follows:

$$K=[1-(HL/(UCL-NHT)]$$

where HL is the hearing loss at threshold (in dB), UCL is the upper comfort level (in dB), and NHT is the normal hearing threshold (in dB). Thus, the apparatus of the present invention may be customized to suit the individual hearing impairment of the wearer as determined by conventional audiological examination. The multiplicative AGC circuit 16-n in the present invention provides either no gain for signal intensities at the upper sound comfort level or a gain equivalent to the hearing loss for signal intensities associated with the normal hearing threshold in that frequency band.

Figure 2B:
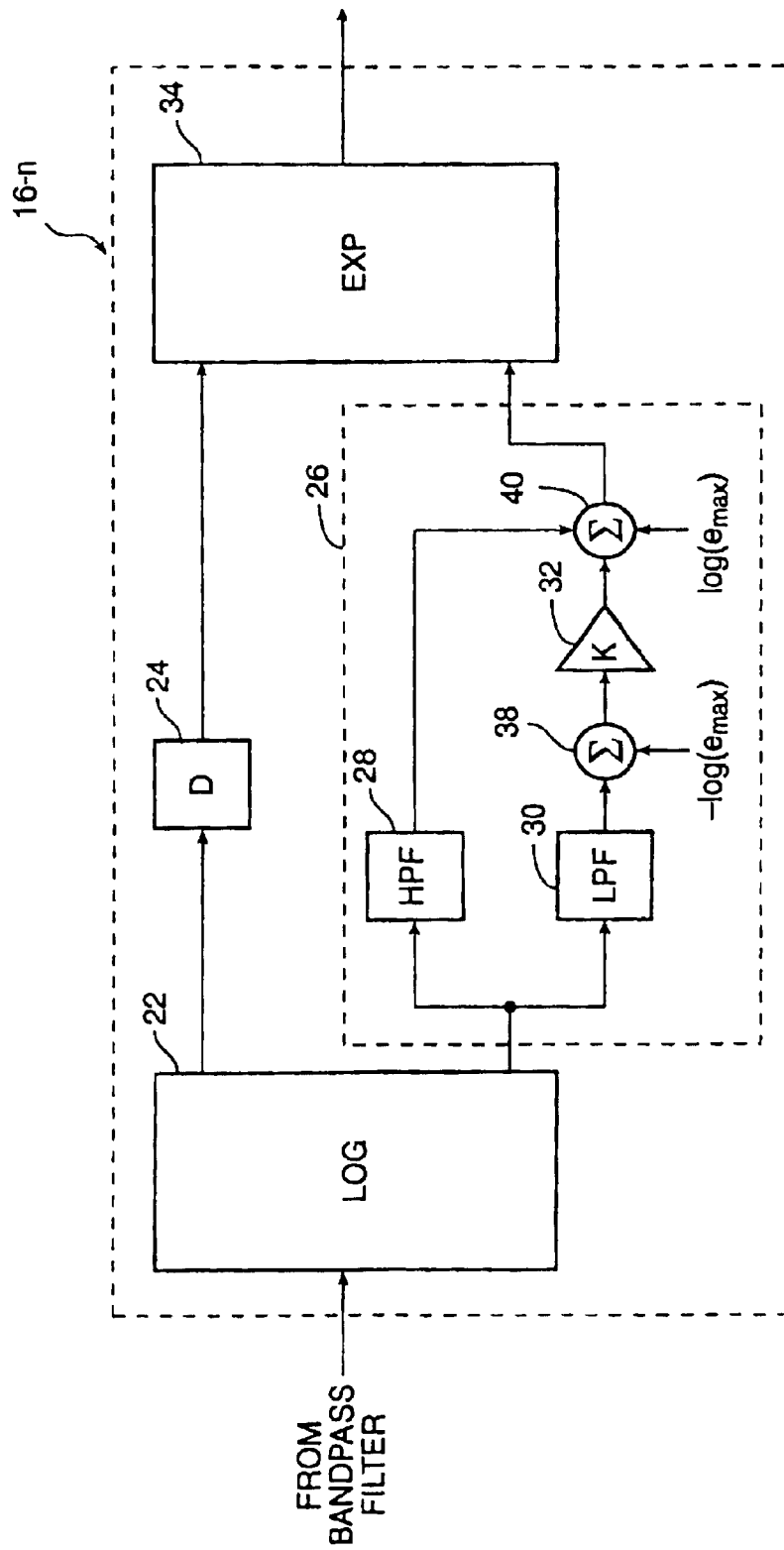
FIG. 2B illustrates a block diagram of an alternative embodiment of the multiplicative AGC circuit shown in FIG. 2A suitable for use according to the present invention.
Figure 2C:
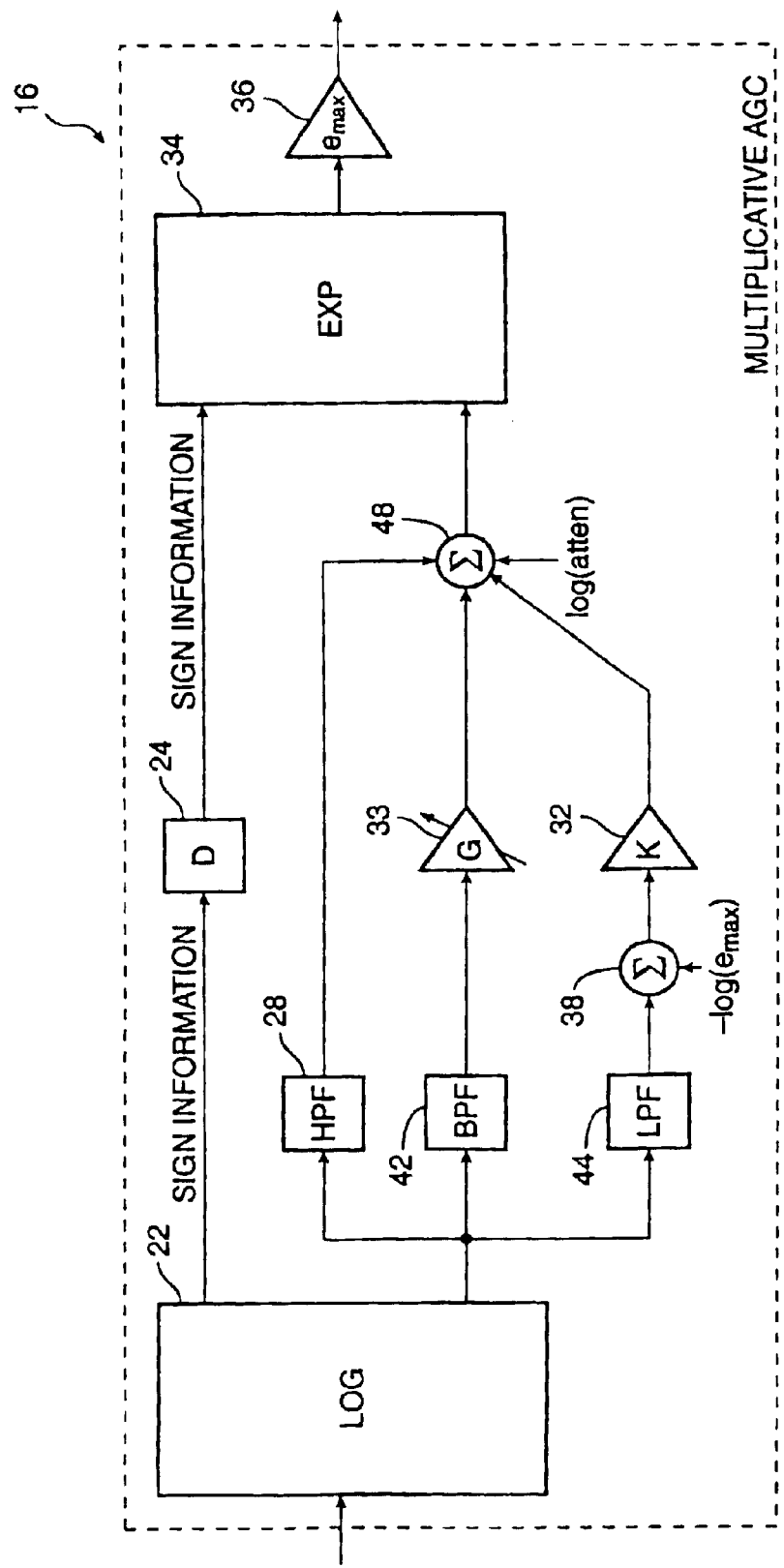
FIG. 2C illustrates a block diagram of a first embodiment of a multiplicative AGC circuit with noise suppression according to the present invention.

In embodiments of the block diagram shown in FIGS. 2A-2C, when K>1, the AGC circuit 16-n becomes an expander. Useful applications of such a circuit include noise reduction by expanding a desired signal.

In contrast, those of ordinary skill in the art will recognize that embodiments of block diagrams shown in FIGS. 2A-2C where the value of K is negative (in a typical useful range of about zero to negative one), soft sounds will become loud and loud sounds will become soft. Useful applications of the present invention in this mode include systems for improving the intelligibility of a low volume audio signal on the same signal line with a louder signal.

Despite the fact that multiplicative AGC has been available in the literature since 1968, and has been mentioned as having potential applicability to hearing aid circuits, it has been largely ignored by the hearing aid literature. Researchers have agreed, however, that some type of frequency dependent gain is necessary to provide adequate hearing compensation and noise suppression, since hearing loss is also frequency dependent. Yet even this agreement is clouded by perceptions that a bank of filters with AGC will destroy speech intelligibility if more than a few frequency bands are used, see, e.g., R. Plomp, The Negative Effect of Amplitude Compression in Hearing Aids in the Light of the Modulation-Transfer Function, Journal of the Acoustical Society of America, 83, 6, June 1983, pp. 2322–2327. An approach, whereby a separately configured multiplicative AGC for a plurality of sub-bands across the audio spectrum may be used according to the present invention is a substantial advance in the art.

FIG. 2B is a block diagram of a variation of the circuit shown in FIG. 2A. Persons of ordinary skill in the art will recognize that amplifier 20 may be eliminated and its gain (1/$e_{max}$) may be equivalently implemented by subtracting the value log[$e_{max}$] from the output of low pass filter 30 in subtractor circuit 38. Similarly, in FIG. 2B, amplifier 36 has been eliminated and its gain ($e_{max}$) has been equivalently implemented by adding the value log[$e_{max}$] to the output from amplifier 32 in adder circuit 40 without departing from the concept of the present invention. In a digital embodiment of FIG. 2B, the subtraction or addition may be achieved by simply subtracting/adding the amount log[$e_{max}$]; while in an analog implementation, a summing amplifier such as shown in examples in "Microelectronic Circuits", by A. S. Sedra and K. C. Smith, Holt Rinehart and Winston, 1990, pp. 62–65, may be used.

When noise is present, the input signal to the multiplicative system may be characterized as follows:

$$s(t) = [e_d(t) \times e_n(t)] v(t)$$

where $e_d(t)$ is the dynamic part of the envelope, and $e_n(t)$ is the near stationary part of the envelope.

According to a preferred embodiment of the multiplicative AGC circuit 16 of the present invention, FIG. 2C illustrates noise suppression that is performed on the near stationary parts of the envelope, $e_n(t)$. In FIG. 2C, the second output of LOG block 22 is connected to high pass filter 28, bandpass filter 42, and low-pass filter 44. The high pass filter 28 is preferably set to 16 Hz as described above to separate $\log|v(t)|$ and $\log[e_d(t) \times e_n(t)]$ which is equivalently $\log[e_d(t)] + \log[e_n(t)]$, where $e_d(t)$ and $e_n(t)$ are positive quantities.

In the preferred embodiment, the band pass filter 42 is implemented with a single order pole at 16 Hz that is consistent with the desired operation of separating the $\log[e_d(t)]$ and $\log[e_n(t)]$ signals of the envelope amplitude and a zero (i.e. a zero response) at D.C. (an example of a preferred implementation of a band pass filter transfer function which provides this response is indicated in FIG. 4B). According to the present invention, sounds that remain nearly constant in envelope amplitude for more than 6 seconds are characterized as stationary. Accordingly, the specification of the lower cutoff frequency to be ⅙ Hz for the band-pass filter 42 corresponds to signals with a 6 second duration. It will be appreciated by those of ordinary skill in the art that other cut-off frequencies and filter orders may be selected to implement the desired specifications for separating the $\log[e_d(t)]$ and $\log[e_n(t)]$ signal portions of the envelope according to the present invention.

Figure 4A:
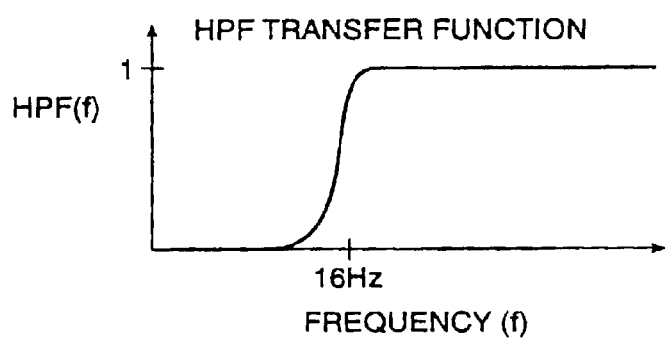
FIGS. 4A-4C illustrate plots of the response characteristics of the filters employed in the multiplicative AGC circuit of FIG. 2C according to the present invention.
Figure 4B:
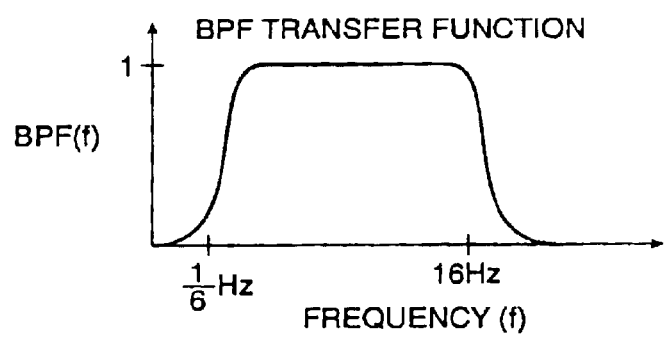
Figure 4C:
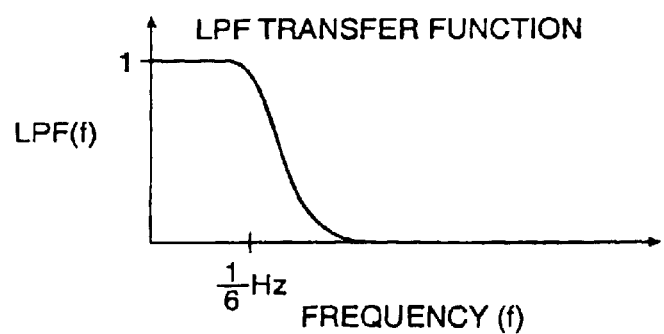

FIGS. 4A-4C illustrate the transfer functions of the high pass filter 28, the band pass filter 42 and the low pass filter 44, respectively. In FIG. 4A, the output of the high pass filter 28 is the log $|v(t)|$. In FIG. 4B, the output of the band pass filter 42, is the logarithm of the dynamic or rapidly varying time envelope, often associated with speech, such as for $\log[e_d(t)]$. In FIG. 4C, the output of the low pass filter 44 is the logarithm of the near stationary or slowly varying time envelope, $\log[e_n(t)]$. The near stationary envelope is most often associated with noise such as a multi-talker speech background that provides a constant din, a fan with a constant level of output hum, or white or colored noise with a constant power level.

According to the present invention, the noise, $e_n(t)$, may be reduced by a linear attenuation factor, atten, wherein the amplitude is changed so as to equal the original amplitude times the atten factor. A reduction in the level of the constant component of sound (i.e., the near stationary envelope) is obtained by adding the logarithm of the attenuation to the $\log[e_n(t)]$. Referring now to FIG. 2C, log[atten], the value of which is negative for atten values less than one, is added to the output of the amplifier 32. It should be appreciated that the inclusion of $-\log[e_{max}]$ is made in place of the amplifier 20 as taught with respect to node 38 illustrated in FIG. 2B.

Still referring to FIG. 2C, the outputs of the amplifiers 32 and 33 along with the output of high pass filter 28 are added with the log[atten] factor at the summing node 48 with the output connected to the exponentiation block 34.

The value of gain G selected for amplifier block 33 is determined by the amount of desired enhancement to be applied to the dynamic portions of speech. In the present invention the value of G is selected to be in the range $$K \leq G \leq K - \frac{\log(atten)}{\log(e_{dmax})}$$

where $e_{dmax}$ is the level of the dynamic or speech portion which the designer prefers to be restored to the signal level as if there were no noise attenuation. In the preferred embodiment, $e_{dmax}$ is set to value of the comfortable listening level and the attenuation value is set to 0.1. Hence, with this choice of variables, the output signal is attenuated by a factor of 0.1 but the dynamic portion of the envelope is amplified by a factor G to provide enhancement. Those with ordinary skill in the art will understand that other values of G may be selected to provide specific desired output levels for the dynamic portions of the signal envelope, including a time varying calculation for values of G based upon short term averages of the output of BPF 42 (or equivalently $\log[e_d(t)]$), without deviating from the teachings of this invention.

The output of summing junction 48 is connected to the second input of exponent block 34. The first input of exponent block 34 contains the sign information of v(t), and when combined with the input at the second input of exponent block 34 forms an output of exponent block 34 as follows:

$$atten \cdot \left(\frac{e_n}{e_{max}}\right)^K (e_d)^G v(t)$$

Accordingly, the multiplicative AGC circuit 16 set forth in FIG. 2C will attenuate an acoustic signal having a relatively constant amplitude for more than approximately six seconds but will provide increased gain (by virtue of the constant G) to dynamic and speech signals. Preferably, the value of atten, the logarithm of which is added to the summing junction block 48 may be under the control of the user of the hearing aid. In this manner, the user of the hearing aid may set the background noise attenuation in a way that is analogous to the selection of volume by a volume control. It will be appreciated by those of ordinary skill in the art that any variety of known volume control devices typically employed in hearing aids or stereo sound systems may be employed to adjust the background noise attenuation level in either a digital or an analog system.

Figure 5A:
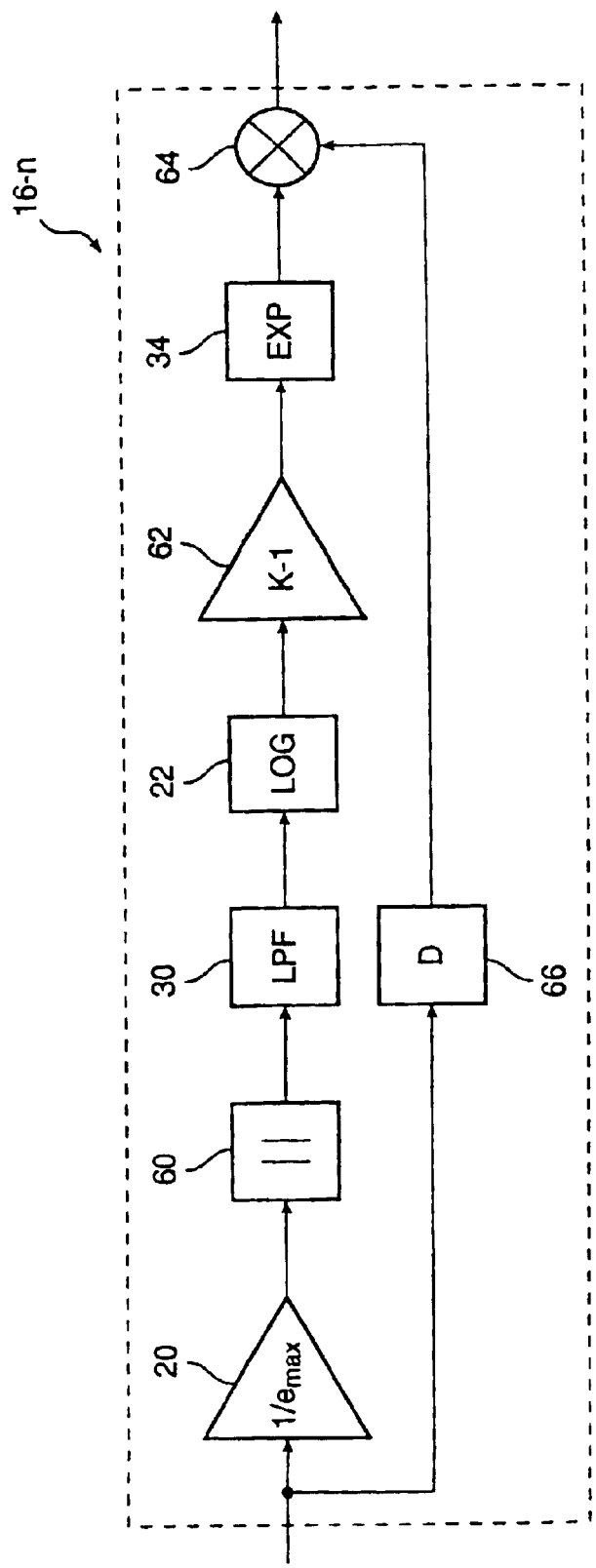
FIG. 5A illustrates a block diagram of a second embodiment of a multiplicative AGC circuit suitable for use according to the present invention.

Referring now to FIG. 5A, a block diagram is presented of an alternate embodiment of the multiplicative AGC circuit 16-n of the present invention wherein the logarithm function follows the low-pass filter function. Those of ordinary skill in the art will appreciate that the individual blocks of the circuit of FIG. 5A which have the same functions as corresponding blocks of the circuit of FIG. 2A may be configured from the same elements as the corresponding ones of the blocks of FIG. 2A.

Like the multiplicative AGC circuit 16-n of FIG. 2A, the multiplicative AGC circuit 16-n of FIG. 5A accepts an input signal at amplifier 20 from the output of one of the audio bandpass filters 14-n shown in FIG. 1. Still referring to FIG. 5A, amplifier 20 is set to have a gain of $1/e_{max}$, where $e_{max}$ is the maximum allowable value of the audio envelope for which AGC gain is to be applied.

The output of amplifier 20 is passed to absolute value circuit 60. In an analog implementation, there are numerous known ways to implement absolute value circuit 60, such as given, for example, in A. S. Sedra and K. C. Smith, Microelectronic Circuits, Holt, Rinehart and Winston Publishing Co., 2nd ed. 1987. In a digital implementation, those skilled in the art know that the absolute value circuit can be implemented by simply by taking the magnitude of the digital number at the input of the circuit.

The output of absolute value circuit 60 is passed to low-pass filter 30. Low-pass filter 30 may be configured in the same manner as disclosed with reference to FIG. 2A. Those of ordinary skill in the art will recognize that the combination of the absolute value circuit 60 and the low-pass filter 30 provides an estimate of the envelope e(t), and hence is known as an envelope detector. Several implementations of envelope detectors are well known in the art and may be used without departing from the teachings of the invention. Since, in the embodiment of FIG. 5A, the low-pass filter 30 precedes the LOG block 22, it is preferred that the cutoff frequency be up to ⅛ of the critical bandwidth of the cutoff frequency. It should be appreciated, however, that a nominal cutoff frequency of 16 Hz may also be employed.

In a presently preferred embodiment, the output of low-pass filter 30 is processed in the LOG block 22 to derive the logarithm of the signal. The input to the LOG block 22 is always positive due to the action of absolute value block 60, hence no phase or sign term from the LOG block 22 is used. Again, because the gain of the amplifier 20 is set to $1/e_{max}$, the output of amplifier 20 for inputs less than $e_{max}$, will never be greater than one and the logarithm term out of LOG block 22 will always be 0 or less.

In FIG. 5A, an alternative implementation of LOG block 22 from the description provided with respect to FIG. 2A may be made, because less accuracy is required in the LOG block 22 implementation in FIG. 5A. It should be understood that this alternative implementation is not considered suitable for use in the implementation of LOG block 22 of FIG. 2A because an unacceptably high level of noise is created by the inaccuracies. In this alternative embodiment of LOG block 22, the exponent and the fractional part of the mantissa of the floating point representation of the input to LOG block 22 are added together to form the output of the LOG block 22. For example, the floating point representation of the number 12 pursuant to IEEE standard 754-1985 format is $1.5 \times 2^3$. In accordance with the alternative implementation of LOG block 22, the value of $\log_2 12$ is treated as 3.5, since the sum of the exponent of $2^3$ and the fractional part of 1.5 is calculated as 3+0.5=3.5. The true value of $\log_2 12$ is 3.58496. The error of approximately 2% is considered acceptable.

The logarithmic output signal of LOG block 22 is presented to an amplifier 62 having a gain equal to (K−1). Other than its gain being different from amplifier 32 of FIG. 2A, amplifiers 32 and 62 may be similarly configured. The output of amplifier 62 is presented to the input of EXP block 34, which processes the signal to provide an exponential (anti-log) function.

The output of EXP block 34 is combined with a delayed version of the input to amplifier 20 in multiplier 64, where delay element 66 functions to provide the appropriate amount of delay. There are a number of known ways to implement multiplier 64. In a digital implementation, this is simply a multiplication of two digital values. In an analog implementation, an analog multiplier such as shown in A. S. Sedra and K. C. Smith, Microelectronic Circuits, Holt, Rinehart and Winston Publishing Co., 3rd ed. 1991 (see especially page 900) is required.

As in the embodiment depicted in FIG. 2A, the input to amplifier 20 of the embodiment of FIG. 5A is delayed prior to presentation to the input of multiplier 64. Delay block 66 has a delay equal to the group delay of low pass filter 30.

Figure 5B:
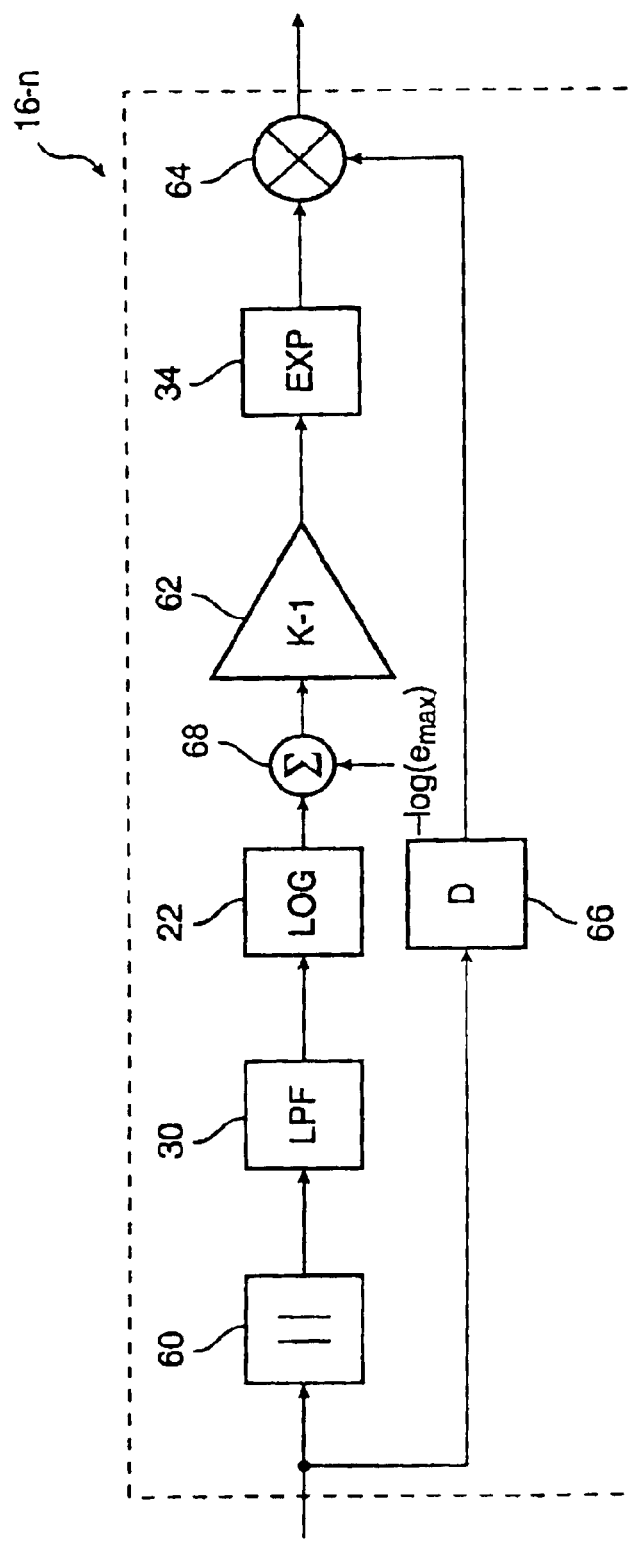
FIG. 5B illustrates a block diagram of an alternative embodiment of the multiplicative AGC circuit shown in FIG. 5A suitable for use according to the present invention.

FIG. 5B is a block diagram of a circuit which is a variation of the circuit shown in FIG. 5A. Those of ordinary skill in the art will recognize that amplifier 20 may be eliminated and its gain, $1/e_{max}$, may be equivalently implemented by subtracting the value $\log[e_{max}]$ from the output of LOG block 22 in summing circuit 68, as shown in FIG. 5B, without deviating from the concepts herein.

Figure 5C:
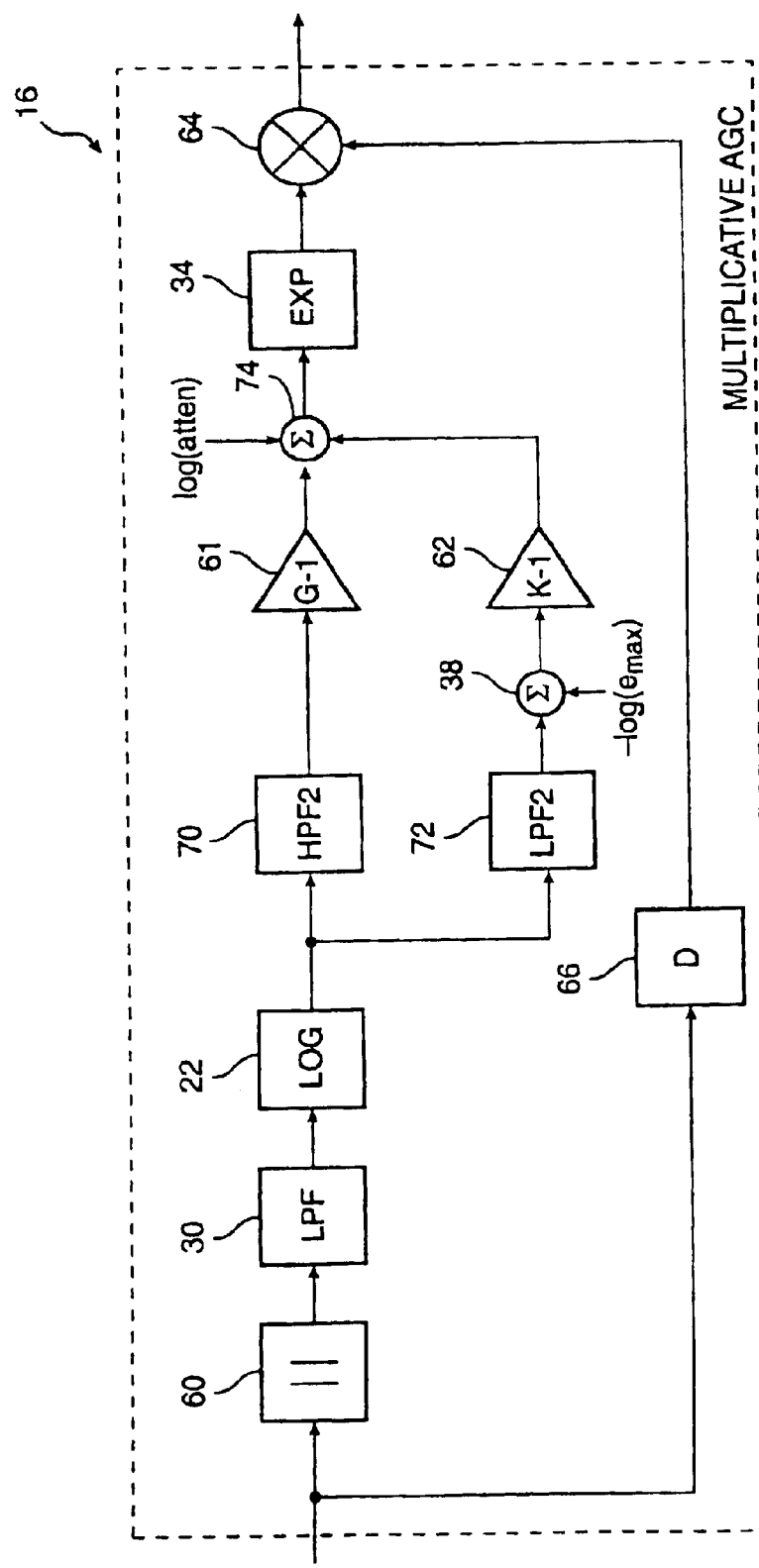
FIG. 5C illustrates a block diagram of a second embodiment of a multiplicative AGC circuit with noise suppression according to the present invention.

FIG. 5C illustrates a preferred embodiment of a multiplicative AGC circuit 16 including noise suppression according to the present invention. The multiplicative AGC circuit 16 is similar to the multiplicative AGC circuit 16-n depicted in FIGS. 5A and 5B, except that the noise suppression components according to the present invention have been included. Accordingly, only the additional circuit elements illustrated in FIG. 5C will be described herein.

Figure 6:
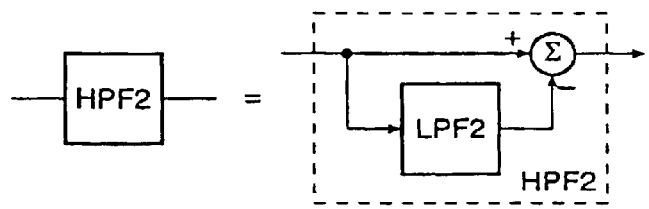
FIG. 6 illustrates the implementation of a high pass filter suitable for use according to the present invention.
Figure 7A:
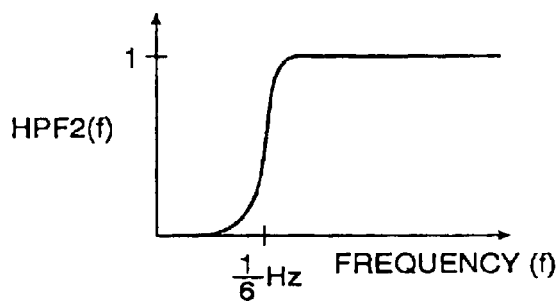
FIGS. 7A and 7B illustrate plots of the response characteristics of the filters employed in the multiplicative AGC circuit of FIGS. 5C, 5D, and 5E according to the present invention.
Figure 7B:
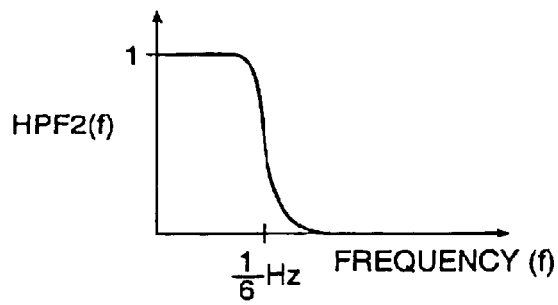

According to the present invention, the log[e(t)] at the output of LOG block 22 is connected to the high pass filter 70 and the low pass filter 72. The implementation of the low pass filter 72 may be made with a simple first order low pass filter characteristic having a corner at ⅙ Hz, embodiments of which are well known to those of ordinary skill in the art. The high pass filter 70 may be implemented with the understanding that the first order high pass filter transfer function is the low pass filter function subtracted from 1. A high pass filter 70 implemented in this manner is depicted in FIG. 6, and is well known to those of ordinary skill in the art. The transfer functions for the high pass filter 70 and the low pass filter 72 are illustrated in FIGS. 7A and 7B, respectively. It will be appreciated that filter orders and cut off frequencies other than those recited herein may be selected as a matter of design choice according to the present invention.

Alternatively, the high pass filter 70 and the low pass filter 72 of FIG. 5C may be replaced with a noise estimator in a manner illustrated in FIG. 8. Various implementations of noise estimators are well known to those of ordinary skill in the art. A suitable implementation of a noise estimator is suggested in the article by Harry Teder, "Hearing Instruments in Noise and the Syllabic Speech-to-Noise Ratio," Hearing Instruments, Vol. 42, No. 2, 1991 recited above. In this embodiment, switching artifacts are generated as the noise estimator switches between an estimate of the noise when speech is present and an estimate when the speech is absent.

Turning again to FIG. 5C, the output of the high pass filter 70 is $\log[e_d(t)]$, representing the dynamic portion of the acoustic signal envelope. The output of the low pass filter 72 is $\log[e_n(t)]$, representing the near stationary portion of the signal envelope. At the summing junction 38, the value $\log[e_{max}]$ is subtracted from the output of the low pass filter 72 in the same manner as the value $\log[e_{max}]$ was subtracted at the summing junction 68 in FIG. 5B. The dynamic portion of the logarithm of the signal which is the output from HPF2 block 70 is amplified by the gain (G−1). According to the present invention, the value log[atten] is then also added to the outputs of the amplifier blocks 61 and 62 at the summing junction 74.

The output from the summing junction 74 is input into the exponentiation block 34. The output of the exponentiation block 34 is multiplied by the value of the input signal through the delay block 66 by multiplier 64. The selection of K as described above, along with the selection of the attenuation value, atten, may be made in two or more of the multiplicative AGC circuits 16 to provide a similar attenuation of the background noise across several of the channels. The attenuation value, atten, may be controlled by a volume control circuit in a manner as described above.

Figure 5D:
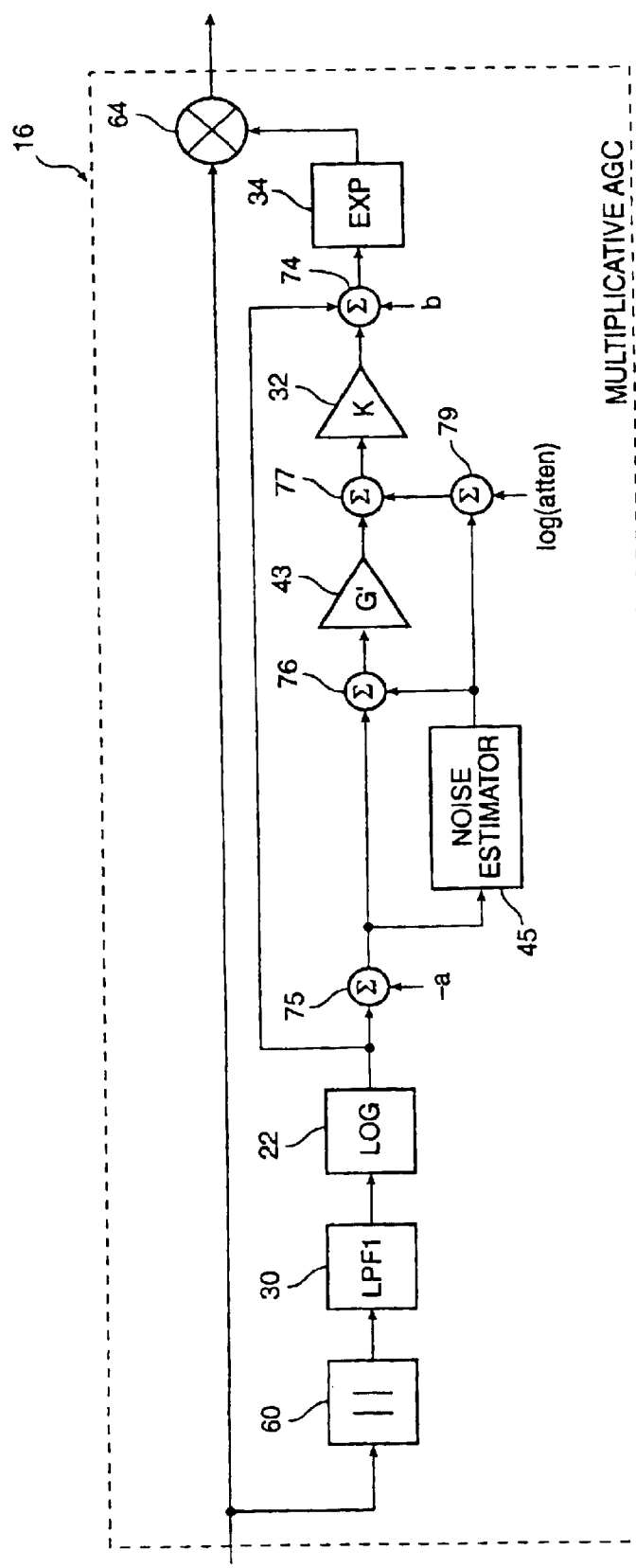
FIG. 5D illustrates a block diagram of a third embodiment of a multiplicative AGC circuit with noise suppression according to the present invention.

FIG. 5D illustrates an alternative embodiment of noise suppression according to the present invention. In FIG. 5D output of the LOG block 22 is split into two paths. One output from LOG block 22 is fed into the summing junction 75 and a quantity designated by "a" is added. The value of "a" is the logarithm (to the same base as the log in block 22) of the threshold value of sound for the respective AGC band 16-n. As recited earlier, a noise estimator block 45 is used to provide an estimate of the stationary portion of the logarithm of the envelope, $\log[e_n(t)]$. An estimate of the dynamic portion of the logarithm of the envelope, $\log[e_d(t)]$, is obtained at the output of the summing junction 76 by adding the output of the summing junction 75 to the output of the noise estimator block 45. This output from summing junction 76 is then multiplied by a gain G' which is $$G' = 1 - \frac{X \log(atten)}{|\log[e_d(t)]| - Y \cdot \log(atten)}.$$

where $$Y = \frac{k}{k(K\max - 1) + \log(atten)}$$

and

X=K max·Y

The choice of an adaptive gain G' is obtained from three specifications: (1) the maximum gain Kmax which corresponds to the gain to restore a maximum desired speech level to a comfortable listening level; (2) the amount of desired attenuation, atten; and (3) the value of $k=\log[e_d(t)]$ for which unity gain is desired.

Still referring to FIG. 5D, the output of the noise estimator block 45 is also combined with the log[atten] at summing junction 79. The outputs of this summing junction 79 and the amplifier G' are summed injunction 77 and the subsequent output is multiplied by K in block 32. The output from LOG block 22 is then subtracted from the output of the multiplier K (the selection of K being recited earlier) and then summed at summing junction 74 with the logarithm of the threshold for the user, "b".

Figure 5E:
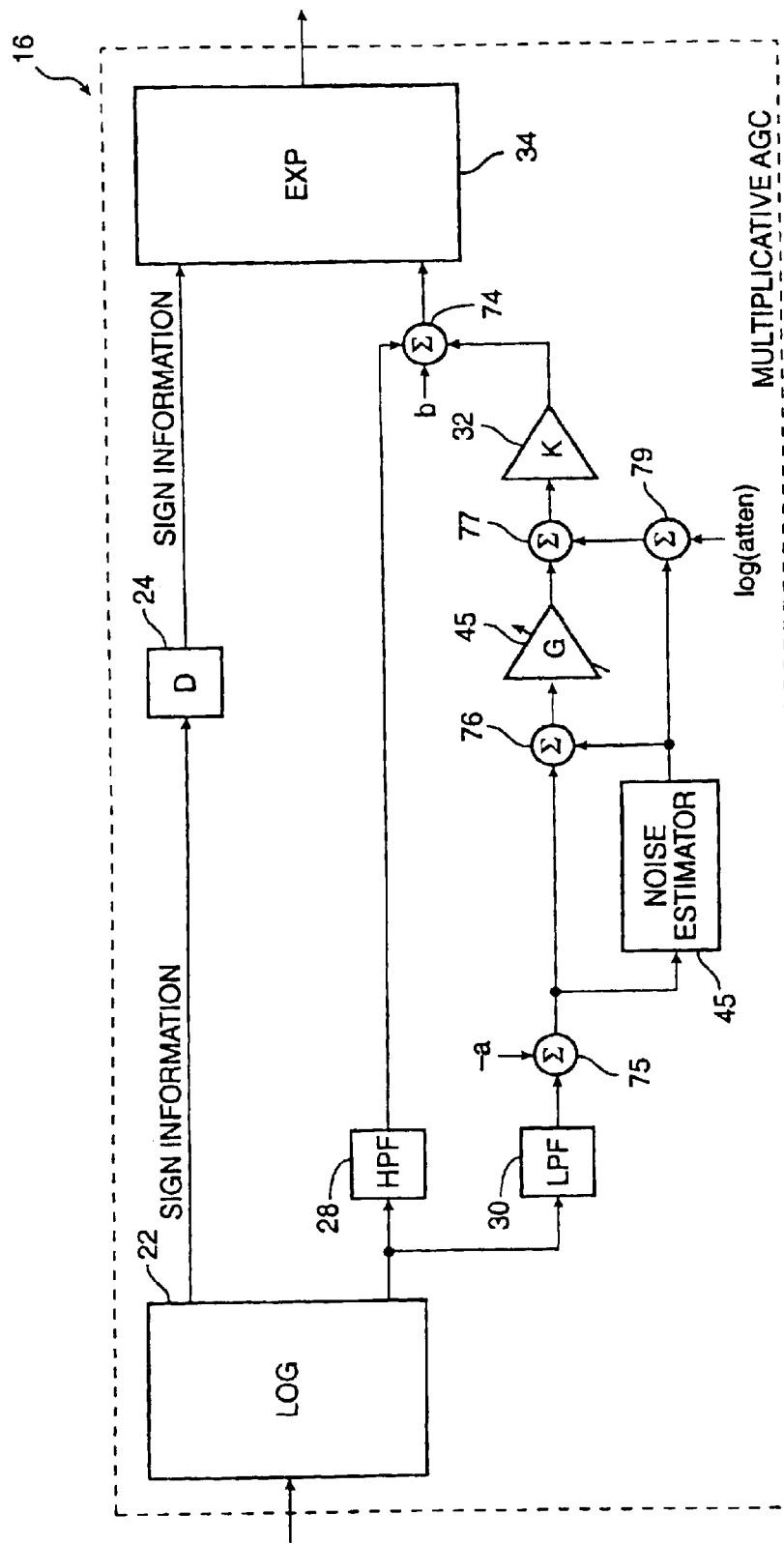
FIG. 5E illustrates a block diagram of a fourth embodiment of a multiplicative AGC circuit with noise suppression according to the present invention.

FIG. 5E illustrates another embodiment of noise reduction according to the present invention.

While the multiplicative AGC circuits 16-n shown in FIGS. 2A-2C and FIGS. 5A-5C are implemented differently, it has been determined that the output resulting from either the log-lowpass implementation of FIGS. 2A-2C and the output resulting from the lowpass-log implementation of FIGS. 5A-5C are substantially equivalent, and the output of one cannot be said to be more desirable than the other. In fact, it is thought that the outputs are sufficiently similar to consider the output of either a good representation for both. Listening results of tests performed for speech data to determine if the equivalency of the log-lowpass and the lowpass-log was appropriate for the human auditory multiplicative AGC configurations indicate the intelligibility and fidelity in both configurations was nearly indistinguishable.

Although intelligibility and fidelity are equivalent in both configurations, analysis of the output levels during calibration of the system for specific sinusoidal tones revealed that the lowpass-log maintained calibration while the log-lowpass system deviated slightly from calibration. While either configuration would appear to give equivalent listening results, calibration issues favor the low-pass log implementation of FIGS. 5A-5C.

The multi-band multiplicative AGC adaptive compression approach of the present invention has no explicit feedback or feed forward. With the addition of a modified soft-limiter to the multiplicative AGC circuit 16-n, a stable transient response and a low noise floor are ensured. Such an embodiment of a multiplicative AGC circuit for use in the present invention is shown in FIG. 9A.

Figure 9A:
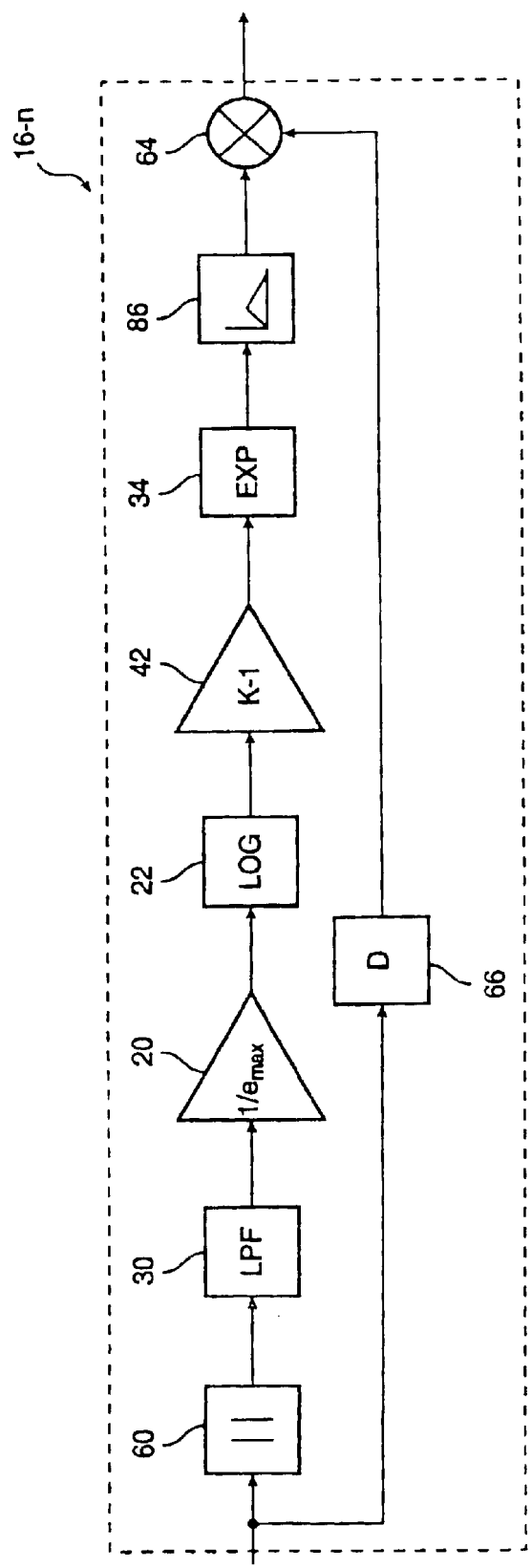
FIG. 9A illustrates a block diagram of a third embodiment of a multiplicative AGC circuit suitable for use according to the present invention.

The embodiment of FIG. 9A is similar to the embodiment shown in FIG. 5A, except that, instead of feeding the absolute value circuit 60, amplifier 20 follows the low-pass filter 30. In addition, a modified soft limiter 86 is interposed between EXP block 34 and multiplier 64. In an analog implementation, soft limiter 86 may be designed, for example, as in A. S. Sedra and K. C. Smith, Microelectronic Circuits, Holt, Rinehart and Winston Publishing Co., 2nd ed. 1987 (see especially pp. 230–239) with the slope in the saturation regions asymptotic to zero. The output of block 86 is the gain of the system. The insertion of the soft limiter block 86 in the circuit of FIG. 9A limits the gain to the maximum value which is set to be the gain required to compensate for the hearing loss at threshold.

In a digital implementation, soft limiter 86 may be realized as a subroutine which provides an output to multiplier 64 equal to the input to soft limiter 86 for all values of input less than the value of the gain to be realized by multiplier 64 required to compensate for the hearing loss at threshold and provides an output to multiplier 64 equal to the value of the gain required to compensate for the hearing loss at threshold for all inputs greater than this value. Those of ordinary skill in the art will recognize that multiplier 64 functions as a variable gain amplifier whose gain is limited by the output of soft limiter 86. It is further convenient, but not necessary, to modify the soft limiter to limit the gain for soft sounds below threshold to be equal to or less than that required for hearing compensation at threshold. If the soft limiter 86 is so modified, then care must be taken to ensure that the gain below the threshold of hearing is not discontinuous with respect to a small change in input level.

Use of the modified soft limiter 86 provides another beneficial effect by eliminating transient overshoot in the system response to an acoustic stimulus which rapidly makes the transition from silence to an uncomfortably loud intensity. The stabilization effect of the soft limiter 86 may also be achieved by introducing appropriate delay into the system, but this can have damaging side effects. Excessive delayed speech transmission to the ear of one's own voice causes a feedback delay which can induce stuttering. Use of the modified soft limiter 86 eliminates the acoustic delay used by other techniques and simultaneously provides stability and an enhanced signal-to-noise ratio.

Figure 9B:
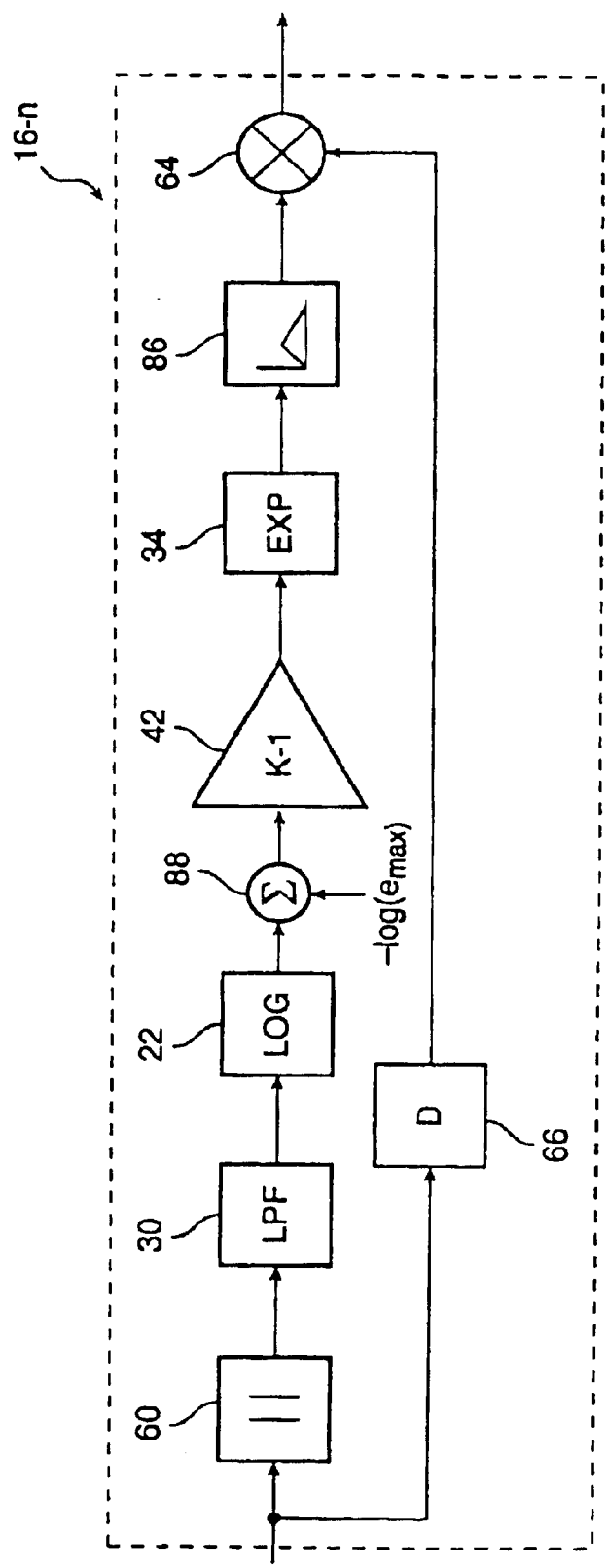
FIG. 9B illustrates a block diagram of an alternative embodiment of the multiplicative AGC circuit shown in FIG. 9A suitable for use according to the present invention.

FIG. 9B is a block diagram of a variation of the circuit shown in FIG. 9A. Those of ordinary skill in the art will recognize that amplifier 20 may be eliminated and its gain function may be realized equivalently by subtracting the value $\log[e_{max}]$ from the output of LOG block 22 in summing circuit 88 as shown in FIG. 9B without deviating from the concepts herein.

Figure 10:
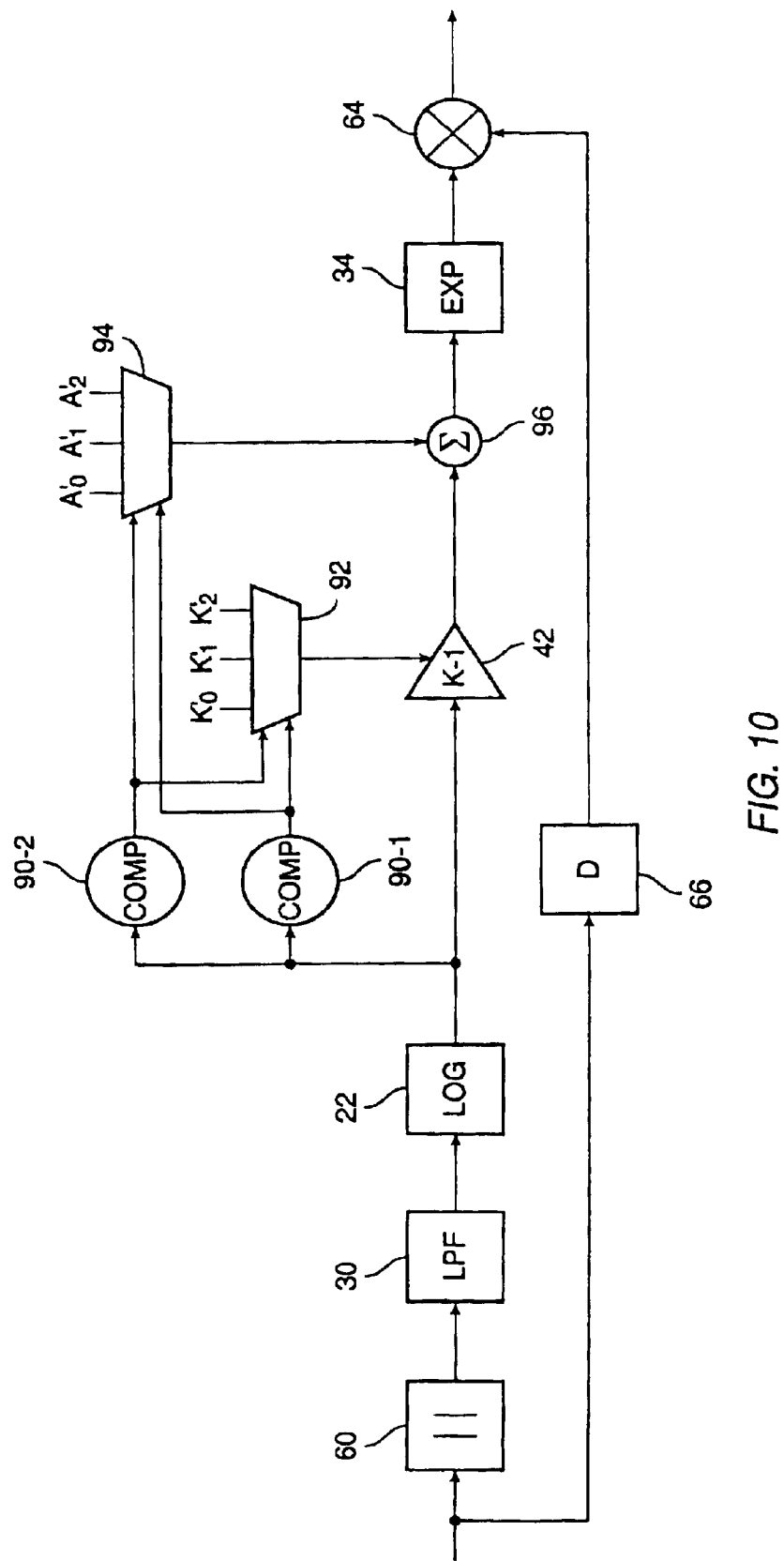
FIG. 10 illustrates a block diagram of a presently preferred embodiment of a multiplicative AGC circuit according to the present invention.
Figure 11:
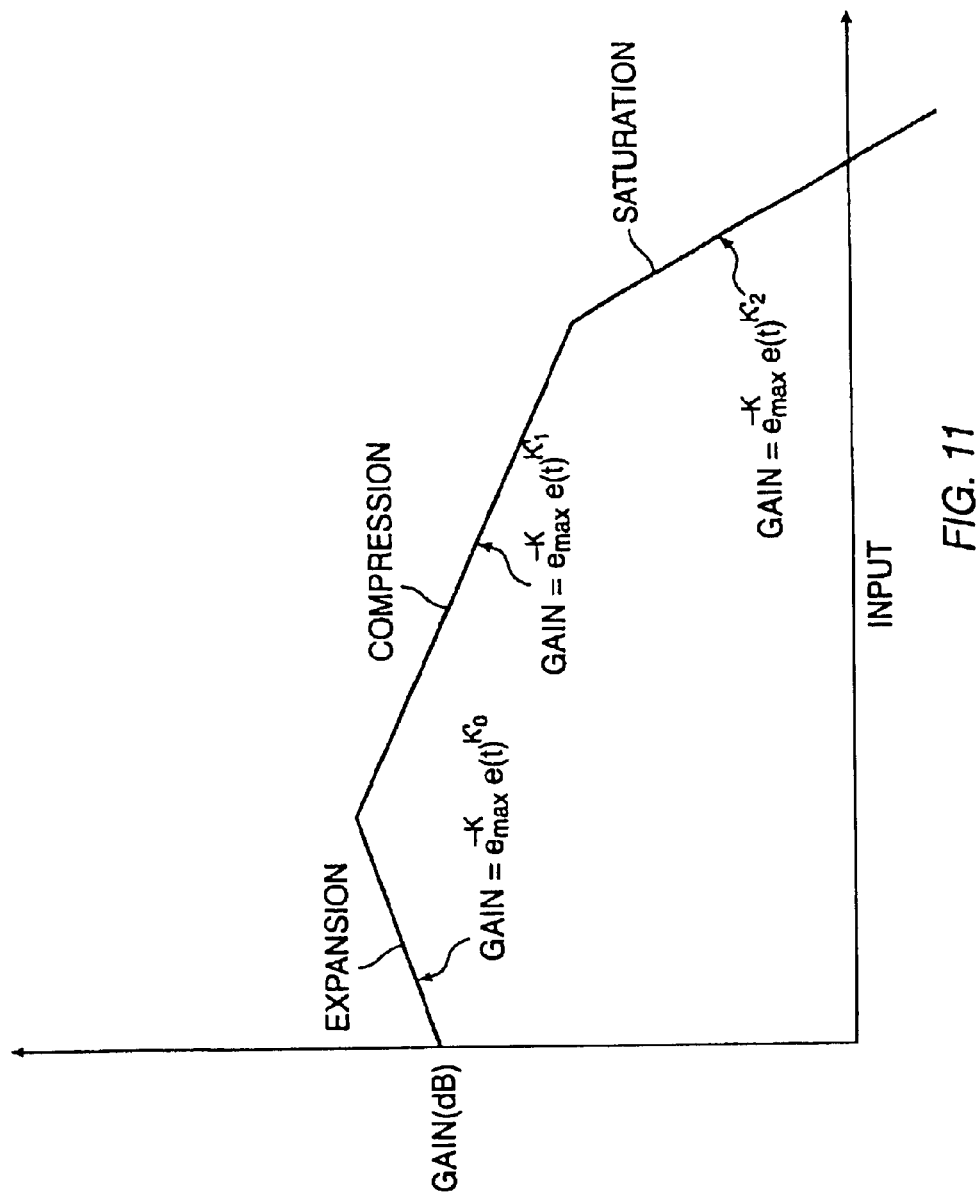
FIG. 11 illustrates a plot of the three slope gain regions of the multiplicative AGC circuits of FIG. 10 according to the present invention.

Turning now to FIG. 10, a preferred embodiment of multiplicative AGC circuit 16 implementing a three slope gain curve according to the present invention is illustrated. In FIG. 10, the output of the LOG block 22 is connected to first and second comparator circuits 90-1 and 90-2. The comparator circuits compare the output of LOG block 22 with predetermined input levels to determine which of the three gain regions in FIG. 11 is applied. The outputs of first and second comparator circuits are connected to the first and second select inputs of gain multiplexer 92 and normalization multiplexer 94. The first, second and third inputs, $K_0'$, $K_1'$, and $K_2'$ to gain multiplexer 92 provide the value of (K−1) in the amplifier 42.

The first, second and third inputs, $A_0'$, $A_1'$, and $A_2'$ to normalization multiplexer 94 provide the normalization implemented by the amplifier 20 in FIGS. 2A, 5A, and 9A by adding the value (K−1) log[$e_{max}$] to the output of amplifier 42 by summing node 96. Since the normalization occurs after the operation of amplifier 42, it should be appreciated that the value of K is included in each of the three inputs to the normalization multiplexer 94. Further, the value of K included in each of the three inputs corresponds to the value of K that is employed by amplifier 42 in response to the output from gain multiplexer 92.

According to this embodiment of the present invention, comparator circuits 90-1 and 90-2 divide the amplitude of the output from LOG block 22 into expansion, compression and saturation regions. An exemplary graph of the gain provided to the input in the three regions is illustrated in FIG. 11. The upper limit of the expansion region is set by the threshold hearing loss determined during a fitting of the hearing aid on the user. When the amplitude of the output from LOG block 22 is below the threshold hearing loss, the inputs $K_0'$ and $A_0'$ will be selected, and the gain of the amplifier 42 will preferably provide expansive gain to the input. For input signal energy at low levels constituting unwanted noise, expansion is useful by reducing the gain to those low level signals.

The lower limit of the compression region is set by the threshold hearing loss, and the upper limit is set by compression provided to the signal in the compression region and the compression provided in the saturation region. When the amplitude of the output from LOG block 22 is above the threshold hearing loss, and below the upper limit of the compression region, the inputs $K_1'$ and $A_1'$ will be selected, and the gain of the amplifier 42 will preferably provide compressive gain to the input. The compression provided in each channel will be determined during the fitting of the hearing aid.

When the amplitude of the output from LOG block 22 is above the upper limit of the compression region, the inputs $K_2'$ and $A_2'$ will be selected, and the gain of the amplifier 42 will preferably provide compressive gain to the input. The compression in the saturation region will typically be greater than the compression in the compression region. In the saturation region, the output is limited to a level below the maximum output capability of the output transducer. This is preferred to other types of output limiting, such as peak clipping.

An alternate method for achieving stability is to add a low level (i.e. with an intensity below the hearing threshold level) of noise to the inputs to the audio bandpass filters 14-1 through 14-n. This noise should be weighted such that its spectral shape follows the threshold-of-hearing curve for a normal hearing individual as a function of frequency. This is shown schematically by the noise generator 100 in FIG. 1. Noise generator 100 is shown injecting a low level of noise into each of audio bandpass filters 14-1 through 14-n. Numerous circuits and methods for noise generation are well known in the art.

In the embodiments of FIGS. 5A-5D, FIGS. 9A and 9B, and FIG. 10, the subcircuit comprising absolute value circuit 60 followed by low-pass filter 30 functions as an envelope detector. The absolute value circuit 60 may function as a half-wave rectifier, a full-wave rectifier, or a circuit whose output is the RMS value of the input with an appropriate scaling adjustment. Because the output of this envelope detector subcircuit has a relatively low bandwidth, the envelope updates in digital realizations of this circuit need only be performed at the Nyquist rate for the envelope bandwidth, a rate less than 500 Hz. Those of ordinary skill in the art will appreciate that this will enable low power digital implementations.

The multiplicative AGC full range adaptive compression for hearing compensation differs from the earlier FFT work in several significant ways. The multi-band multiplicative AGC adaptive compression technique of the present invention does not employ frequency domain processing but instead uses time domain filters with similar or equivalent Q based upon the required critical bandwidth. In addition, in contrast to the FFT approach, the system of the present invention employing multiplicative AGC adaptive compression may be implemented with a minimum of delay and no explicit feedforward or feedback.

In the prior art FFT implementation, the parameter to be measured using this prior art technique was identified in the phon space. The presently preferred system of the present invention incorporating multi-band multiplicative AGC adaptive compression inherently includes recruitment, and requires only the measure of threshold hearing loss and upper comfort level as a function of frequency in the embodiments illustrated in FIGS. 2A-2C, FIGS. 5A-5E, and FIGS. 9A and 9B.

Finally, the multi-band multiplicative AGC adaptive compression technique of the present invention utilizes a modified soft limiter 86 or alternatively a low level noise generator 100 which eliminates the additive noise artifact introduced by prior-art processing and maintains sound fidelity. However, more importantly, the prior-art FFT approach will become unstable during the transition from silence to loud sounds if an appropriate time delay is not used. The presently preferred multiplicative AGC embodiment of the present invention is stable with a minimum of delay.

The multi-band, multiplicative AGC adaptive compression approach of the present invention has several advantages. For the embodiments described with respect to FIGS. 2A-2C, FIG. 5A-5E and FIGS. 9A and 9B, only the threshold and upper comfort levels for the person being fitted need to be measured. The same lowpass filter design is used to extract the envelope, e(t), of the sound stimulus s(t), or equivalently the log[e(t)], for each of the frequency bands being processed. Further, by using this same filter design and simply changing the cutoff frequencies of the low-pass filters as previously explained, other applications may be accommodated including those where rapid transition from silence to loud sounds is anticipated.

The multi-band, multiplicative AGC adaptive compression approach of the present invention has a minimum time delay. This eliminates the auditory confusion which results when an individual speaks and hears his or her own voice as a direct path response to the brain and receives a processed delayed echo through the hearing aid system.

Normalization with the factor $e_{max}$, makes it mathematically impossible for the hearing aid to provide a gain which raises the output level above a predetermined upper comfort level, thereby protecting the ear against damage from excessive sound intensity. For sound input levels greater than $e_{max}$ the device attenuates sound rather than amplifying it. Those of ordinary skill in the art will recognize that further ear protection may be obtained by limiting the output to a maximum safe level without departing from the concepts herein.

A separate exponential constant K is used for each frequency band which provides precisely the correct gain for all input intensity levels, hence, no switching between linear and compression ranges occurs. Thus, switching artifacts are eliminated.

The multi-band, multiplicative AGC adaptive compression approach of the present invention has no explicit feedback or feedforward. With the addition of a modified soft limiter, stable transient response and a low noise floor are ensured. A significant additional benefit over the prior art which accrues to the present invention as a result of the minimum delay and lack of explicit feedforward or feedback in the multiplicative AGC is the amelioration of annoying audio feedback or regeneration typical of hearing aids which have both the hearing aid microphone and speaker within close proximity to the ear.

The multiplicative AGC may be implemented with either digital or analog circuitry due to its simplicity. Low power implementation is possible. As previously noted, in digital realizations, the envelope updates (i.e., the operations indicated by amplifier 20, LOG block 22, amplifier 42) need only be performed at the Nyquist rate for the envelope bandwidth, a rate less than 500 Hz, thereby significantly reducing power requirements.

The multi-band, multiplicative AGC adaptive compression system of the present invention is also applicable to other audio problems. For example, sound equalizers typically used in stereo systems and automobile audio suites can take advantage of the multi-band multiplicative AGC approach since the only user adjustment is the desired threshold gain in each frequency band. This is equivalent in adjustment procedure to current graphic equalizers, but the AGC provides a desired frequency boost without incurring abnormal loudness growth as occurs with current systems.

According to another aspect of the present invention, an in-the-ear hearing compensation system employs two transducers converting electrical signal-to-acoustical energy. Two recent developments have made a dual-receiver hearing aid possible. The first is the development of miniaturized moving-coil transducers and the second is the critical-band compression technology disclosed herein and also disclosed and claimed in parent application Ser. No. 08/272,927 filed Jul. 8, 1994, now U.S. Pat. No. 5,500,902.

Figure 12:
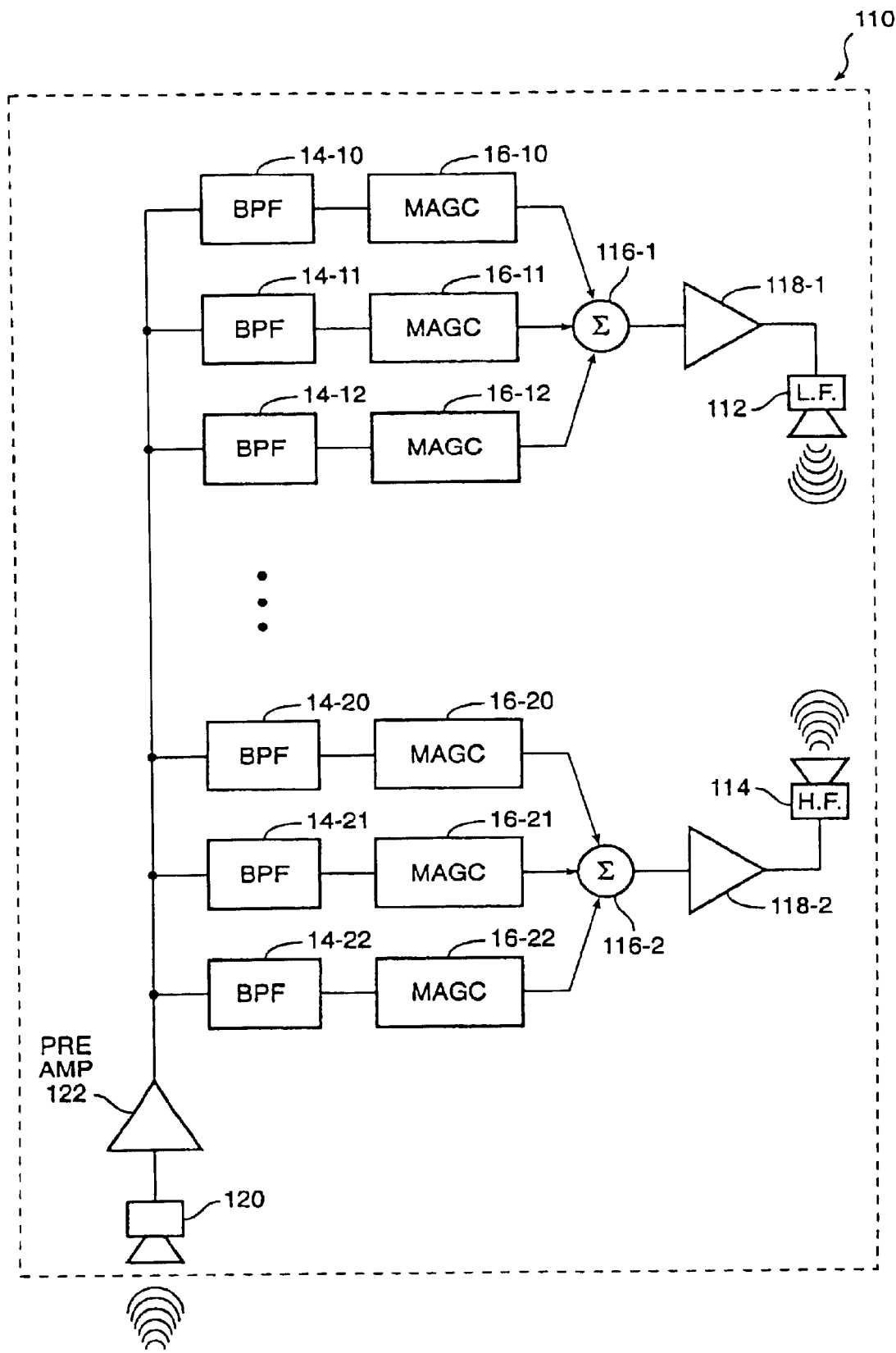
FIG. 12 is a block diagram of an in-the-ear hearing compensation system according to the present invention employing two transducers converting electrical signals to acoustical energy.

Referring now to FIG. 12, a block diagram of an in-the-ear hearing compensation system 110 employing two transducers converting electrical-signal to acoustical-energy is presented. A first such transducer 112, such as a conventional iron-armature hearing-aid receiver is employed for low frequencies (e.g., below 1 kHz) and a second such transducer 114 is employed for high frequencies (e.g., above 1 kHz).

Demand for high-fidelity headphones for portable electronic devices has spurred development of moving-coil transducers less than ½ inch diameter that provide flat response over the entire audio range (20–20,000 Hz). To fit in the ear canal, a transducer must be less than ¼ inch in diameter, and therefore the commercially available transducers are not applicable. A scaling of the commercial moving-coil headphone to 3/16 in diameter yields a transducer that has excellent efficiency from 1 kHz to well beyond the upper frequency limit of human hearing. The system of the present invention uses such a scaled moving-coil transducer 114 as the tweeter, and a standard Knowles (or similar) iron-armature hearing-aid transducer 112 as the woofer. Both of these devices together can easily be fit into the ear canal.

The hearing compensation system shown in FIG. 12 is conceptually identical to the parent invention except that the processing channels, each containing a bandpass filter and multiplicative AGC gain control, are divided into two groups. The first group, comprising bandpass filters 14-10, 14-11, and 14-12 and multiplicative AGC circuits 16-10, 16-11, and 16-12, processes signals with frequencies below the resonance of the iron-armature transducer 112. The second group, comprising bandpass filters 14-20, 14-21, and 14-22 and multiplicative AGC circuits 16-20, 16-21, and 16-22 processes signals above the resonance of the iron-armature transducer 114. The outputs of the first group of processing channels are summed in summing element 116-1, and fed to power amplifier 118-1, which drives iron-armature transducer 112. The outputs of the second group of processing channels are summed in summing element 116-2, and fed to power amplifier 118-2, which drives high-frequency moving-coil transducer 114. The inputs to both processing channels are supplied by electret microphone 120 and preamplifier 122.

Using the arrangement shown in FIG. 12 where the frequency separation into high and low components is accomplished using the bandpass filters, no crossover network is needed, thereby simplifying the entire system. Persons of ordinary skill in the art will appreciate that processing and amplifying elements in the first group may be specialized for the frequency band over which they operate, as can those of the second group. This specialization can save considerable power dissipation in practice. Examples of such specialization include using power amplifiers whose designs are optimized for the particular transducer, using sampling rates appropriate for the bandwidth of each group, and other well-known design optimizations.

An alternative to a miniature moving-coil transducer for high-frequency transducer 114 has also been successfully demonstrated by the authors. Modern electrets have a high enough static polarization to make their electromechanical transduction efficiency high enough to be useful as high-frequency output transducers. Such transducers have long been used in ultrasonic applications, but have not been applied in hearing compensation applications. When these electret devices are used as the high-frequency transducer 114, persons of ordinary skill in the art will appreciate that the design specializations noted above should be followed, with particular emphasis on the power amplifier, which must be specialized to supply considerably higher voltage than that required by a moving-coil transducer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multiplicative automatic gain control (AGC) circuit for an apparatus for processing audio signals, said apparatus comprising an input transducer for converting acoustical energy into electrical energy corresponding to said acoustical energy, a plurality of audio bandpass filters coupled to the output of said input transducer, a plurality of said multiplicative AGC circuits comprising noise suppression circuitry, wherein each of said multiplicative AGC circuits is coupled to the output of one of said audio bandpass filters, a first summing junction coupled to the output of said multiplicative AGC circuits, a first amplifier coupled to the output of said first summing junction, and an output transducer for converting electrical energy into acoustical energy, said multiplicative AGC circuit comprising:

an absolute value circuit having one input coupled to the output of one of said audio bandpass filters;

a first lowpass filter having an input coupled to the output of said absolute value circuit;

a logarithmic element having an input coupled to the output of said lowpass filter;

a filter element having an input coupled to the output of said logarithmic element;

an exponential element having an input coupled to the output of said filter element;

a delay element having an input coupled to the input of said absolute value circuit, wherein said delay element compensates for the delay through said filter element; and a multiplier having one input coupled to the output of said exponential element and a second input coupled to the output of said delay element.

2. The multiplicative AGC circuit as defined in claim 1, wherein said filter element further comprises:

a high pass filter having an input coupled to the output of said logarithmic element;

a second amplifier having an input coupled to the output of said high pass filter, wherein said second amplifier has a gain equal to (G−1);

a second lowpass filter having an input also coupled to the output of said logarithmic element;

a second summing junction having a first output coupled to the output of said second lowpass filter and a second input equal to −log[$e_{max}$], where $e_{max}$ is the maximum allowable value of the audio envelope for which AGC gain is applied;

a third amplifier having an input coupled to the output of said first summing junction, wherein said third amplifier has a gain equal to (K−1); and a third summing junction having a first input coupled to the output of said second amplifier, a second input coupled to the output of said third amplifier and a third input equal to log[atten], wherein atten is a linear attenuation factor.

3. An apparatus for processing audio signals comprising:

an input transducer for converting acoustical energy into electrical energy corresponding to said acoustical energy;

a plurality of audio bandpass filters coupled to the output of said input transducer;

a plurality of multiplicative automatic gain control (AGC) circuits comprising noise suppression circuitry, each of said multiplicative AGC circuits coupled to an output of one of said audio bandpass filters, one of said plurality of AGC circuits comprising:

an absolute value circuit having one input coupled to the output of one of said audio bandpass filters;

a first lowpass filter having an input coupled to the output of said absolute value circuit;

a logarithmic element having an input coupled to the output of said lowpass filter;

a filter element having an input coupled to the output of said logarithmic element;

an exponential element having an input coupled to the output of said filter element;

a delay element having an input coupled to the input of said absolute value circuit, wherein said delay element compensates for the delay through said filter element; and a multiplier having one input coupled to the output of said exponential element and a second input coupled to the output of said delay element;

a first summing junction coupled to the output of said multiplicative AGC circuits;

a first amplifier coupled to the output of said first summing junction; and an output transducer for converting electrical energy into acoustical energy.

4. An apparatus for processing audio signals comprising:

a means for converting acoustical energy into electrical energy corresponding to said acoustical energy;

a plurality of means for audio bandpass filtering coupled to the output of said means for converting acoustical energy;

a plurality of means for multiplicative automatic gain control (AGC), each of said means for multiplicative AGC coupled to an output of one of said means for audio bandpass filtering, one of said plurality of AGC circuits comprising:

an means for providing an absloute value having one input coupled to the output of one of said means for audio bandpass filtering;

a first means for lowpass filtering having an input coupled to the output of said means for providing an absloute value;

a means for providing a logarithmic value having an input coupled to the output of said first means for lowpass filtering;

a means for filtering having an input coupled to the output of said means for providing a logarithmic value;

an means for providing an exponential value having an input coupled to the output of said means for filtering;

a means for delaying having an input coupled to the input of said means for providing an absloute value, wherein said means for delaying compensates for the delay through said means for filtering; and a means for multiplying having one input coupled to the output of said means for providing an exponential value and a second input coupled to the output of said means for delaying;

a first means for summing coupled to the output of said means for multiplicative AGC;

a first means for amplifying coupled to the output of said first means for summing; and a means for converting electrical energy into acoustical energy.

5. A multiplicative automatic gain control (AGC) circuit for an apparatus for processing audio signals, said apparatus comprising an input transducer for converting acoustical energy into electrical energy corresponding to said acoustical energy, a plurality of audio bandpass filters coupled to the output of said input transducer, a plurality of said multiplicative AGC circuits comprising noise suppression circuitry, wherein each of said multiplicative AGC circuits is coupled to the output of one of said audio bandpass filters, a first summing junction coupled to the output of said multiplicative AGC circuits, a first amplifier coupled to the output of said first summing junction, and an output transducer for converting electrical energy into acoustical energy, said multiplicative AGC circuit comprising:

a logarithmic element having an input coupled to the output of one of said audio bandpass filters, said logarithmic element having a first output carrying a signal indicating the sign of a signal at said input of said logarithmic element and a second output carrying a signal proportional to the logarithm of the absolute value of said signal at said input of said logarithmic element;

a filter element having an input coupled to said second output of said logarithmic element, said filter element comprising:
  a lowpass filter having an input coupled to said second output of said logarithmic element;
  a band pass filter having an input also coupled to said second output of said logarithmic element;
  a high pass filter having an input also coupled to said second output of said logarithmic element;
  a second summing junction having a first input coupled to the output of said lowpass filter and having a second input equal to $-\log[e_{max}]$, where $e_{max}$ is the maximum allowable value of the audio envelope for which AGC gain is applied;
  a second amplifier having an input coupled to the output of said second summing junction;
  a third amplifier having an input coupled to the output of said band pass filter; and
  a third summing junction having a first input coupled to the output of said high pass filter, a second input coupled to the output of said second amplifier, a third input coupled to the output of said third amplifier and a fourth input equal to log[atten], wherein said third summing junction provides an output equal to the sum of its four inputs, and wherein atten is a linear attenuation factor;
a delay element having an input coupled to first output of said logarithmic element, wherein said delay element compensates for the delay through said filter element;
an exponential element having a first input coupled to the output of said delay element and a second input coupled to the output of said filter element; and
a fourth amplifier element coupled to the output of said exponential element, wherein said fourth amplifier has a gain equal to $(e_{max})$, where $e_{max}$ is the maximum allowable value of the audio envelope for which AGC gain is applied.

6. A multiplicative automatic gain control (AGC) circuit for an apparatus for processing audio signals, said apparatus comprising an input transducer for converting acoustical energy into electrical energy corresponding to said acoustical energy, a plurality of audio bandpass filters coupled to the output of said input transducer, a plurality of said multiplicative AGC circuits comprising noise suppression circuitry, wherein each of said multiplicative AGC circuits is coupled to the output of one of said audio bandpass filters, a first summing junction coupled to the output of said multiplicative AGC circuits, a first amplifier coupled to the output of said first summing junction, and an output transducer for converting electrical energy into acoustical energy, said multiplicative AGC circuit comprising:
  an absolute value circuit having an input coupled to the output of one of said audio bandpass filters;
  a lowpass filter having an input coupled to the output of said absolute value circuit;
  a logarithmic element having an input coupled to the output of said lowpass filter;
  a second summing junction having a first input coupled to the output of said logarithmic element and a second input equal to the logarithm of the threshold value of sound for said multiplicative AGC circuit;
  a noise estimator having an input coupled to the output of said second summing junction;
  a third summing junction having a first input coupled to the output of said second summing junction and a second input coupled to the inverted output of said noise estimator;
  a second amplifier having an input coupled to the output of said third summing junction, wherein said second amplifier has a gain of G';
  a fourth summing junction having a first input coupled to the output of said second amplifier;
  a fifth summing junction having an input coupled to the output of said noise estimator and having a second input equal to log[atten], wherein atten is a linear attenuation factor;
  a third amplifier having an input coupled to the output of said fourth summing junction;
  a sixth summing junction having a first input coupled to the output of said third amplifier, a second input coupled to the output of said logarithmic element and a third input equal to the logarithm of the threshold value of sound for said multiplicative AGC circuit;
  an exponential element having an input coupled to the output of said sixth summing junction; and
  a multiplier having a first input coupled to the output of said exponential element and having a second input coupled to the output of one of said audio bandpass filters.

7. A multiplicative automatic gain control (AGC) circuit for an apparatus for processing audio signals, said apparatus comprising an input transducer for converting acoustical energy into electrical energy corresponding to said acoustical energy, a plurality of audio bandpass filters coupled to the output of said input transducer, a plurality of said multiplicative AGC circuits comprising noise suppression circuitry, wherein each of said multiplicative AGC circuits is coupled to the output of one of said audio bandpass filters, a first summing junction coupled to the output of said multiplicative AGC circuits, a first amplifier coupled to the output of said first summing junction, and an output transducer for converting electrical energy into acoustical energy, said multiplicative AGC circuit comprising:
  a logarithmic element having an input coupled to the output of one of said audio bandpass filters, said logarithmic element having a first output carrying a signal indicating the sign of a signal at said input of said logarithmic element and a second output carrying a signal proportional to the logarithm of the absolute value of said signal at said input of said logarithmic element;
  a filter element having an input coupled to said second output of said logarithmic element, said filter element comprising:
    a high pass filter having an input coupled to the output of said logarithmic element;
    a lowpass filter having an input also coupled to the output of said logarithmic element;
    a second summing junction having a first input coupled to the output of said lowpass filter and having a second input coupled to a value equal to the logarithm of the threshold value of sound for said multiplicative AGC circuit;
    a noise estimator having an input coupled to the output of said second summing junction;
    a third summing junction having a first input coupled to the output of said second summing junction and a second input coupled to the inverted output of said noise estimator;
    a second amplifier having an input coupled to the output of said third summing junction;
    a fourth summing junction having an input coupled to the output of said noise estimator and a second input equal to log[atten], wherein atten is a linear attenuation factor;

a fifth summing junction having a first input coupled to the output of said second amplifier and a second input coupled to the output of said fourth summing junction;

a third amplifier having an input coupled to the output of said fifth summing junction; and a sixth summing junction having a first input coupled to the output of said third amplifier, a second input coupled to the output of said highpass filter, and a third input equal to equal to the logarithm of the threshold value of sound for said multiplicative AGC circuit, wherein said sixth summing junction provides an output equal to the sum of its three inputs;

a delay element having an input coupled to first output of said logarithmic element, wherein said delay element compensates for the delay through said filter element; and an exponential element having a first input coupled to the output of said delay element and a second input coupled to the output of said filter element.

8. A multiplicative automatic gain control (AGC) circuit for an apparatus for processing audio signals, said apparatus comprising an input transducer for converting acoustical energy into electrical energy corresponding to said acoustical energy, a plurality of audio bandpass filters coupled to the output of said input transducer, a plurality of said multiplicative AGC circuits comprising noise suppression circuitry, wherein each of said multiplicative AGC circuits is coupled to the output of one of said audio bandpass filters, a first summing junction coupled to the output of said multiplicative AGC circuits, a first amplifier coupled to the output of said first summing junction, and an output transducer for converting electrical energy into acoustical energy, said multiplicative AGC circuit comprising:

an absolute value circuit having an input coupled to the output of one of said audio bandpass filters;

a lowpass filter having an input coupled to the output of said absolute value circuit;

a logarithmic element having an input coupled to the output of said lowpass filter;

a first comparator circuit having an input coupled to the output of said logarithmic element;

a second comparator circuit having an input also coupled to said output of said logarithmic element;

a gain multiplexer having a first select input coupled to the output of said first comparator circuit and also having a second select input coupled to the output of said second comparator circuit;

a normalization multiplexer having a first select input coupled to the output of said first comparator circuit and also having a second select input coupled to the output of said second comparator circuit;

a second amplifier having a first input coupled to the output of said logarithmic element and having a gain equal to the output of said gain multiplexer;

a second summing junction having a first input coupled to the output of said second amplifier and having a second input coupled to the output of said normalization multiplexer;

an exponential element having an input coupled to the output of said second summing junction;

a delay element having an input coupled to the output of one of said audio bandpass filters; and a multiplier having a first input coupled to the output of said exponential element and having a second input coupled to the output of said delay element.

9. An apparatus for processing audio signals comprising:

an input transducer for converting acoustical energy into electrical energy corresponding to said acoustical energy;

a plurality of audio bandpass filters coupled to the output of said input transducer;

a plurality of multiplicative automatic gain control (AGC) circuits, each of said multiplicative AGC circuits coupled to an output of one of said audio bandpass filters, one of said AGC circuits comprising:

a logarithmic element having an input coupled to the output of one of said audio bandpass filters, said logarithmic element having a first output carrying a signal indicating the sign of a signal at said input of said logarithmic element and a second output carrying a signal proportional to the logarithm of the absolute value of said signal at said input of said logarithmic element;

a filter element having an input coupled to said second output of said logarithmic element, said filter element comprising:

a lowpass filter having an input coupled to said second output of said logarithmic element;

a band pass filter having an input also coupled to said second output of said logarithmic element;

a high pass filter having an input also coupled to said second output of said logarithmic element;

a second summing junction having a first input coupled to the output of said lowpass filter and having a second input equal to $-\log[e_{max}]$, where $e_{max}$ is the maximum allowable value of the audio envelope for which AGC gain is applied;

a second amplifier having an input coupled to the output of said second summing junction;

a third amplifier having an input coupled to the output of said band pass filter; and a third summing junction having a first input coupled to the output of said high pass filter, a second input coupled to the output of said second amplifier, a third input coupled to the output of said third amplifier and a fourth input equal to log[atten], wherein said third summing junction provides an output equal to the sum of its four inputs, and wherein atten is a linear attenuation factor;

a delay element having an input coupled to first output of said logarithmic element, wherein said delay element compensates for the delay through said filter element;

an exponential element having a first input coupled to the output of said delay element and a second input coupled to the output of said filter element; and a fourth amplifier element coupled to the output of said exponential element, wherein said fourth amplifier has a gain equal to $(e_{max})$, where $e_{max}$ is the maximum allowable value of the audio envelope for which AGC gain is applied;

a first summing junction coupled to an output of said multiplicative AGC circuits;

a first amplifier coupled to an output of said first summing junction; and an output transducer for converting electrical energy into acoustical energy.

10. An apparatus for processing audio signals comprising:

an input transducer for converting acoustical energy into electrical energy corresponding to said acoustical energy;

a plurality of audio bandpass filters coupled to the output of said input transducer;

a plurality of multiplicative automatic gain control (AGC) circuits comprising noise suppression circuitry, each of said multiplicative AGC circuits coupled to an output of one of said audio bandpass filters, at least one of said AGC circuits comprising:

an absolute value circuit having an input coupled to the output of one of said audio bandpass filters;

a lowpass filter having an input coupled to the output of said absolute value circuit;

a logarithmic element having an input coupled to the output of said lowpass filter;

a second summing junction having a first input coupled to the output of said logarithmic element and a second input equal to the logarithm of the threshold value of sound for said multiplicative AGC circuit;

a noise estimator having an input coupled to the output of said second summing junction;

a third summing junction having a first input coupled to the output of said second summing junction and a second input coupled to the inverted output of said noise estimator;

a second amplifier having an input coupled to the output of said third summing junction, wherein said second amplifier has a gain of G';

a fourth summing junction having a first input coupled to the output of said second amplifier;

a fifth summing junction having an input coupled to the output of said noise estimator and having a second input equal to log[atten], wherein atten is a linear attenuation factor;

a third amplifier having an input coupled to the output of said fourth summing junction;

a sixth summing junction having a first input coupled to the output of said third amplifier, a second input coupled to the output of said logarithmic element and a third input equal to the logarithm of the threshold value of sound for said multiplicative AGC circuit;

an exponential element having an input coupled to the output of said sixth summing junction; and a multiplier having a first input coupled to the output of said exponential element and having a second input coupled to the output of one of said audio bandpass filters;

a first summing junction coupled to an output of said multiplicative AGC circuits;

a first amplifier coupled to the output of said first summing junction; and an output transducer for converting electrical energy into acoustical energy.

11. An apparatus for processing audio signals apparatus comprising:

an input transducer for converting acoustical energy into electrical energy corresponding to said acoustical energy;

a plurality of audio bandpass filters coupled to an output of said input transducer;

a plurality of multiplicative automatic gain control (AGC) circuits, each of said multiplicative AGC circuits coupled to an output of one of said audio bandpass filters;

a first summing junction coupled to the output of said multiplicative AGC circuits;

a first amplifier coupled to the output of said first summing junction;

an output transducer for converting electrical energy into acoustical energy;

one of said multiplicative AGC circuits comprising:

a logarithmic element having an input coupled to the output of one of said audio bandpass filters, said logarithmic element having a first output carrying a signal indicating the sign of a signal at said input of said logarithmic element and a second output carrying a signal proportional to the logarithm of the absolute value of said signal at said input of said logarithmic element;

a filter element having an input coupled to said second output of said logarithmic element, said filter element comprising:

a high pass filter having an input coupled to the output of said logarithmic element;

a lowpass filter having an input also coupled to the output of said logarithmic element;

a second summing junction having a first input coupled to the output of said lowpass filter and having a second input coupled to a value equal to the logarithm of the threshold value of sound for said multiplicative AGC circuit;

a noise estimator having an input coupled to the output of said second summing junction;

a third summing junction having a first input coupled to the output of said second summing junction and a second input coupled to the inverted output of said noise estimator;

a second amplifier having an input coupled to the output of said third summing junction;

a fourth summing junction having an input coupled to the output of said noise estimator and a second input equal to log[atten], wherein atten is a linear attenuation factor;

a fifth summing junction having a first input coupled to the output of said second amplifier and a second input coupled to the output of said fourth summing junction;

a third amplifier having an input coupled to the output of said fifth summing junction; and a sixth summing junction having a first input coupled to the output of said third amplifier, a second input coupled to the output of said highpass filter, and a third input equal to equal to the logarithm of the threshold value of sound for said multiplicative AGC circuit, wherein said sixth summing junction provides an output equal to the sum of its three inputs;

a delay element having an input coupled to first output of said logarithmic element, wherein said delay element compensates for the delay through said filter element; and an exponential element having a first input coupled to the output of said delay element and a second input coupled to the output of said filter element.

12. An apparatus for processing audio signals apparatus comprising:

an input transducer for converting acoustical energy into electrical energy corresponding to said acoustical energy;

a plurality of audio bandpass filters coupled to an output of said input transducer;

a plurality of multiplicative automatic gain control (AGC) circuits coupled to an output of one of said audio bandpass filters, a plurality of AGC circuits comprising:

an absolute value circuit having an input coupled to the output of one of said audio bandpass filters;
a lowpass filter having an input coupled to the output of said absolute value circuit;
a logarithmic element having an input coupled to the output of said lowpass filter;
a first comparator circuit having an input coupled to the output of said logarithmic element;
a second comparator circuit having an input also coupled to said output of said logarithmic element;
a gain multiplexer having a first select input coupled to the output of said first comparator circuit and also having a second select input coupled to the output of said second comparator circuit;
a normalization multiplexer having a first select input coupled to the output of said first comparator circuit and also having a second select input coupled to the output of said second comparator circuit;
a second amplifier having a first input coupled to the output of said logarithmic element and having a gain equal to the output of said gain multiplexer;
a second summing junction having a first input coupled to the output of said second amplifier and having a second input coupled to the output of said normalization multiplexer;
an exponential element having an input coupled to the output of said second summing junction;
a delay element having an input coupled to the output of one of said audio bandpass filters; and
a multiplier having a first input coupled to the output of said exponential element and having a second in put coup led to the output of said delay element;
a first summing junction coupled to the output of said multiplicative AGC circuits;
a first amplifier coupled to the output of said first summing junction; and
a transducer for converting electrical energy into acoustical energy.

13. An apparatus for processing audio signals comprising:
a first means for converting acoustical energy into electrical energy corresponding to said acoustical energy;
plurality means for audio bandpass filtering coupled to the output of said first means for converting acoustical energy;
a plurality of means for multiplicative automatic gain control (AGC), each of said means for multiplicative AGC coupled to said means for audio bandpass filtering, one of said means for multiplicative AGC comprising:
  a means for generating a logarithmic value coupled to the output of one of said means for audio bandpass filtering, said means for generating a logarithmic value having a first output carrying a signal indicating the sign of a signal at said input of said means for generating a logarithmic value and a second output carrying a signal proportional to the logarithm of the absolute value of said signal at said input of said means for generating a logarithmic value;
  a means for filtering coupled to said second output of said means for generating a logarithmic value, said means for filtering comprising:
    a means for lowpass filtering having an input coupled to said second output of said means for generating a logarithmic value;
    a means for band pass filtering having an input also coupled to said second output of said means for generating a logarithmic value;
    a means for high pass filtering having an input also coupled to said second output of said means for generating a logarithmic value;
  a second means for summing having a first input coupled to the output of said means for lowpass filtering and having a second input equal to $-\log[e_{max}]$, where $e_{max}$ is the maximum allowable value of the audio envelope for which AGC gain is applied;
  a second means for amplifying having an input coupled to the output of said second means for summing;
  a third means for amplifying having an input coupled to the output of said means for band pass filtering; and
  a third means for summing having a first input coupled to the output of said means for high pass filtering, a second input coupled to the output of said second means for amplifying, a third input coupled to the output of said third means for amplifying and a fourth input equal to log[atten], wherein said third means for summing provides an output equal to the sum of its four inputs, and wherein linear atten is a linear attenuation factor;
  a means for delaying having an input coupled to the first output of said means for generating a logarithmic value, wherein said means for delaying element compensates for the delay through said means for filtering element;
  a means for providing an exponential value having a first input coupled to the output of said means for delay and a second input coupled to the output of said means for filtering element; and
  a fourth means for amplifying coupled to the output of said means for providing an exponential value, wherein said fourth means for amplifying has a gain equal to $(e_{max})$, where $e_{max}$ is the maximum allowable value of the audio envelope for which AGC gain is applied;
a first means for summing coupled to an output of said means for multiplicative AGC;
a first means for amplifying coupled to an output of said first means for summing; and
a means for converting electrical energy into acoustical energy.

14. An apparatus for processing audio signals comprising:
a means for converting acoustical energy into electrical energy corresponding to said acoustical energy;
a plurality of means for audio bandpass filtering coupled to the output of said means for converting acoustical energy;
a plurality of means for multiplicative automatic gain control (AGC) comprising noise suppression circuitry, each of said means for multiplicative AGCcoupled to an output of one of said means for audio bandpass filtering, at least one of said AGC circuits comprising:
  an absolute value circuit having an input coupled to the output of one of said means for audio bandpass filtering;
  a means for lowpass filtering having an input coupled to the output of said absolute value circuit;
  a means for providing a logarithmic value having an input coupled to the output of said means for lowpass filtering;
  a second means for summing having a first input coupled to the output of said means for providing a logarithmic value and a second input equal to the logarithm of the threshold value of sound for said means for multiplicative AGC;

a means for estimating noise having an input coupled to the output of said second means for summing;

a third means for summing having a first input coupled to the output of said second means for summing and a second input coupled to the inverted output of said means for estimating noise;

a second means for amplifying having an input coupled to the output of said third means for summing, wherein said second means for amplifying has a gain of G';

a fourth means for summing having a first input coupled to the output of said second means for amplifying;

a fifth means for summing having an input coupled to the output of said means for estimating noise and having a second input equal to log[atten], wherein atten is a linear attenuation factor;

a third means for amplifying having an input coupled to the output of said fourth means for summing;

a sixth means for summing having a first input coupled to the output of said third means for amplifying, a second input coupled to the output of said means for providing a logarithmic value and a third input equal to the logarithm of the threshold value of sound for said means for multiplicative AGC;

an means for providing an exponential value having an input coupled to the output of said sixth means for summing; and a means for delaying having a first input coupled to the output of said means for providing an exponential value and having a second input coupled to the output of one of said means for audio bandpass filtering;

a first means for summing coupled to an output of said means for multiplicative AGCs;

a first means for amplifying coupled to the output of said first means for summing; and an means for converting electrical energy for converting electrical energy into acoustical energy.

15. An apparatus for processing audio signals apparatus comprising:

a means for converting acoustical energy means for delaying for converting acoustical energy into electrical energy corresponding to said acoustical energy;

a plurality of means for audio bandpass filtering coupled to an output of said means for converting acoustical energy;

a plurality of means for multiplicative automatic gain control (AGC), each of said means for multiplicative AGCcoupled to an output of one of said means for audio bandpass filtering;

a first means for summing coupled to the output of said means for multiplicative AGCs;

a first means for amplifying coupled to the output of said first means for summing;

a means for converting electrical energy into acoustical energy;

one of said means for multiplicative AGC comprising:

a means for providing a logarithmic value having an input coupled to the output of one of said means for audio bandpass filtering, said means for providing a logarithmic value having a first output carrying a signal indicating the sign of a signal at said input of said means for providing a logarithmic value and a second output carrying a signal proportional to the logarithm of the absolute value of said signal at said input of said means for providing a logarithmic value;

a means for filtering having an input coupled to said second output of said means for providing a logarithmic value, said means for filtering comprising:

a means for high pass filtering having an input coupled to the output of said means for providing a logarithmic value;

a means for lowpass filtering having an input also coupled to the output of said means for providing a logarithmic value;

a second means for summing having a first input coupled to the output of said means for lowpass filtering and having a second input coupled to a value equal to the logarithm of the threshold value of sound for said means for multiplicative AGC;

a means for estimating noise having an input coupled to the output of said second means for summing;

a third means for summing having a first input coupled to the output of said second means for summing and a second input coupled to the inverted output of said means for estimating noise;

a second means for amplifying having an input coupled to the output of said third means for summing;

a fourth means for summing having an input coupled to the output of said means for estimating noise and a second input equal to log[atten], wherein atten is a linear attenuation factor;

a fifth means for summing having a first input coupled to the output of said second means for amplifying and a second input coupled to the output of said fourth means for summing;

a third means for amplifying having an input coupled to the output of said fifth means for summing; and a sixth means for summing having a first input coupled to the output of said third means for amplifying, a second input coupled to the output of said means for high pass filtering, and a third input equal to equal to the logarithm of the threshold value of sound for said means for multiplicative AGC, wherein said sixth means for summing provides an output equal to the sum of its three inputs;

a means for delaying having an input coupled to first output of said means for providing a logarithmic value, wherein said means for delaying compensates for the delay through said means for filtering; and a means for providing an exponential value having a first input coupled to the output of said means for delaying and a second input coupled to the output of said means for filtering.

16. An apparatus for processing audio signals apparatus comprising:

a means for converting acoustical energy means for delaying for converting acoustical energy into electrical energy corresponding to said acoustical energy;

a plurality of means for audio bandpass filtering coupled to an output of said means for converting acoustical energy;

a plurality of means for multiplicative automatic gain control (AGC) coupled to an output of one of said means for audio bandpass filtering, a plurality of AGC circuits comprising:

an absolute value circuit having an input coupled to the output of one of said means for audio bandpass filtering;

a means for lowpass filtering having an input coupled to the output of said absolute value circuit;

a means for providing a logarithmic value having an input coupled to the output of said means for lowpass filtering;

a first comparator circuit having an input coupled to the output of said means for providing a logarithmic value;

a second comparator circuit having an input also coupled to said output of said means for providing a logarithmic value;

a gain multiplexer having a first select input coupled to the output of said first comparator circuit and also having a second select input coupled to the output of said second comparator circuit;

a normalization multiplexer having a first select input coupled to the output of said first comparator circuit and also having a second select input coupled to the output of said second comparator circuit;

a second means for amplifying having a first input coupled to the output of said means for providing a logarithmic value and having a gain equal to the output of said gain multiplexer;

a second means for summing having a first input coupled to the output of said second means for amplifying and having a second input coupled to the output of said normalization multiplexer;

an means for providing an exponential value having an input coupled to the output of said second means for summing;

a means for delaying having an input coupled to the output of one of said means for audio bandpass filtering; and a means for delaying having a first input coupled to the output of said means for providing an exponential value and having a second input coupled to the output of said means for delaying;

a first means for summing coupled to the output of said means for multiplicative AGCs;

a first means for amplifying coupled to the output of said first means for summing; and a means for converting electrical energy into acoustical energy.

* * * * *

UNITED STATES PATENT AND TRADEMARK OFFICE
CERTIFICATE OF CORRECTION

PATENT NO. : 6,885,752 B1
DATED : April 26, 2005
INVENTOR(S) : Chabries et al.

It is certified that error appears in the above-identified patent and that said Letters Patent is hereby corrected as shown below:

Title page,
Item [56], References Cited, U.S. PATENT DOCUMENTS, replace
"5,848,171 A   *   12/1998" with
-- 5,848,171 A      12/1998 --; and replace
"6,072,885 A   *   6/2000" with
-- 6,072,885 A      6/2000 --.

Column 5,
Line 35, replace "pace" with -- space --.

Column 17,
Line 35, replace "injunction 77" with -- in junction 77 --.

Column 31,
Line 31, replace "in put" with -- input --.
Line 32, replace "coup led" with -- coupled --.
Line 42, before "plurality", insert -- a --.

Signed and Sealed this

Twenty-fifth Day of October, 2005

JON W. DUDAS
*Director of the United States Patent and Trademark Office*